(12) United States Patent
Ippolito et al.

(10) Patent No.: US 11,652,458 B2
(45) Date of Patent: May 16, 2023

(54) AMPLIFICATION INTERFACE, AND CORRESPONDING MEASUREMENT SYSTEM AND METHOD FOR CALIBRATING AN AMPLIFICATION INTERFACE

(71) Applicant: STMicroelectronics S.r.l., Agrate Brianza (IT)

(72) Inventors: Calogero Marco Ippolito, Aci Castello (IT); Michele Vaiana, San Giovanni la Punta (IT); Angelo Recchia, Fasano (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 70 days.

(21) Appl. No.: 17/372,262

(22) Filed: Jul. 9, 2021

(65) Prior Publication Data

US 2021/0336593 A1 Oct. 28, 2021

Related U.S. Application Data

(63) Continuation of application No. 16/781,493, filed on Feb. 4, 2020, now Pat. No. 11,095,261.

(30) Foreign Application Priority Data

Feb. 8, 2019 (IT) .......................... 102019000001851

(51) Int. Cl.
*H03F 3/45* (2006.01)
*G05F 3/24* (2006.01)
(Continued)

(52) U.S. Cl.
CPC ......... *H03F 3/45183* (2013.01); *G05F 3/245* (2013.01); *G06G 7/186* (2013.01);
(Continued)

(58) Field of Classification Search
CPC ....................................................... H03F 3/45
(Continued)

(56) References Cited

U.S. PATENT DOCUMENTS 4,571,507 A * 2/1986 Collings ................. H03M 1/40
341/161
6,583,398 B2 6/2003 Harkin
(Continued)

OTHER PUBLICATIONS

IT Search Report and Written Opinion for IT Appl. No. 102019000001851 dated Oct. 29, 2019 (10 pages).
(Continued)

*Primary Examiner* — Henry Choe
(74) *Attorney, Agent, or Firm* — Crowe & Dunlevy

(57) ABSTRACT

A thermally-isolated-metal-oxide-semiconducting (TMOS) sensor has inputs coupled to first and second nodes to receive first and second bias currents, and an output coupled to a third node. A tail has a first conduction terminal coupled to the third node and a second conduction terminal coupled to a reference voltage. A control circuit applies a control signal to a control terminal of the tail transistor based upon voltages at the first and second nodes so that a common mode voltage at the first and second nodes is equal to a reference common mode voltage. A differential current integrator has a first input terminal coupled to the second node and a second input terminal coupled to the first node, and provides an output voltage indicative of an integral of a difference between a first output current at the first input terminal and a second output current at the second input terminal.

26 Claims, 8 Drawing Sheets

(51) Int. Cl.
*G06G 7/186* (2006.01)
*H03B 5/24* (2006.01)
*H03F 3/393* (2006.01)

(52) U.S. Cl.
CPC .............. *H03B 5/24* (2013.01); *H03F 3/393* (2013.01); *H03F 3/4565* (2013.01); *H03F 3/45475* (2013.01); *H03F 3/45654* (2013.01); *H03F 3/45753* (2013.01); *H03F 2200/171* (2013.01)

(58) Field of Classification Search
USPC ................................ 330/253, 254, 260, 261
See application file for complete search history.

(56) References Cited

U.S. PATENT DOCUMENTS

| | | | |
|---|---|---|---|
| 6,590,463 | B2 | 7/2003 | Lin |
| 6,653,908 | B1* | 11/2003 | Jones ................... H03B 5/1215 331/177 V |
| 6,693,485 | B1 | 2/2004 | Huber |
| 7,268,338 | B2 | 9/2007 | Liu et al. |
| 8,159,206 | B2 | 4/2012 | Chao et al. |
| 8,284,090 | B2 | 10/2012 | Maurino |
| 8,866,554 | B2* | 10/2014 | Botker ................. H03F 1/0266 330/261 |
| 9,778,804 | B2 | 10/2017 | Liu et al. |
| 11,095,261 | B2 | 8/2021 | Ippolito et al. |
| 2006/0244067 | A1 | 11/2006 | Socher et al. |
| 2007/0030069 | A1 | 2/2007 | Huang |
| 2009/0290626 | A1 | 11/2009 | Thurston et al. |
| 2011/0279181 | A1 | 11/2011 | Fan |
| 2011/0315880 | A1 | 12/2011 | Nemirovsky |
| 2013/0207727 | A1 | 8/2013 | Kusuda |
| 2014/0266435 | A1 | 9/2014 | Botker |
| 2016/0065133 | A1 | 3/2016 | Cong et al. |
| 2017/0205366 | A1 | 7/2017 | Nemirovsky |
| 2018/0131342 | A1 | 5/2018 | Zamprogno et al. |
| 2021/0050200 | A1* | 2/2021 | Song ...................... H03F 3/087 |

OTHER PUBLICATIONS

Christoffersen, Carlos et al: "An Ultra-Low Power CMOS PTAT Current Source," IEEE Catalog No. CFP1054E-CDR, Proceedings of the Argentine School of Micro-Nanoelectronics, Technology and Applications 2010, pp. 35-40.

Fonstad, Clifton: "MOSFETS in the Sub-threshold Region (i.e. a bit below Vt)," MIT OpenCourseWare, http://ocw.mit.edu, 6.012 Microelectronics Devices and Circuits, Fall 2009, Oct. 28, 2009 (17 pages).

Kleczek, Rafal, et al: "Low Voltage Area Efficient Current-Mode CMOS Bandgap Reference in Deep Submicron Technology," MIXDES 2014, 21st International Conference, Mixed Design of Integrated Circuits and Systems, Jun. 19-21, 2014, Lublin, Poland, pp. 247-251.

Nemirovsky Yael et al: "A New Pellistor-Like Gas Sensor Based on Micromachined CMOS Transistor", IEEE Transactions on Electron Devices, IEEE Service Center, Pisacataway, NJ, US, vol. 65, No. 12, Dec. 1, 2018, pp. 5494-5498.

Shan Hengying et al: "A low power CMOS temperature sensor fronted for RFID tags", 2018 IEEE 18th Topical Meeting on Silicon Monolithic Integrated Circuits in RF Systems (SIRF), IEEE, Jan. 14, 2018, pp. 15-18.

Youssef, Mohamed A., et al: "A Novel CMOS Realization of the Differential Input Balanced Output Current Operational Amplifier and its Applications," Analog Integrated Circuits and Signal Processing, 44, 37-53, 2005, Springer Science & Business Media, Inc.

\* cited by examiner

AMPLIFICATION INTERFACE, AND CORRESPONDING MEASUREMENT SYSTEM AND METHOD FOR CALIBRATING AN AMPLIFICATION INTERFACE

CROSS REFERENCE TO RELATED APPLICATION

This application is a continuation of U.S. patent application Ser. No. 16/781,493, filed Feb. 4, 2020, which claims the priority benefit of Italian Application for Patent No. 102019000001851, filed on Feb. 8, 2019, the content of which is hereby incorporated by reference in its entirety to the maximum extent allowable by law.

TECHNICAL FIELD

The embodiments of the present description refer to measurement systems.

BACKGROUND

FIG. 1 shows a typical measurement system. In general, the measurement system comprises a sensor 10 and a processing circuit 40.

In particular, the sensor 10 is configured for supplying a measurement signal MS representing a quantity to be measured. For example, the sensor 1 may be an environmental sensor, such as a temperature sensor, a brightness sensor, etc. The processing circuit 40 is configured for processing the measurement signal MS.

Typically, the measurement signal MS is not directly supplied to the processing circuit 40, but to an amplifier circuit 20 is configured for generating an amplified measurement signal AS. In general, the amplifier circuit 20 is able to carry out various operations. For example, with sensors that supply at output a current signal, the amplifier circuit 20 can supply at output a voltage signal. In addition, the amplifier circuit 20 may be configured for amplifying the variation of the measurement signal MS in such a way as to cover, preferably with its maximum variation, the input dynamic range of the circuit downstream.

For example, frequently, the processing circuit 40 is a digital circuit, such as a programmed microprocessor. In this case, the processing circuit 40 has an associated analog-to-digital (A/D) converter 30 configured for receiving at its input the amplified signal AS and for supplying at its output a digital signal DS that comprises digital samples of the amplified signal AS.

For example, the sensor 10 may comprise one or more TMOS transistors. Specifically, the term TMOS designates a particular MOS (Metal-Oxide-Semiconductor) device. In particular, this device comprises a MOS transistor thermally isolated from the substrate of the integrated circuit that comprises the transistor. Typically, the TMOS is obtained with a suspended structure to help maximize thermal isolation for the remaining portion of the die in which it is obtained.

Consequently, this transistor can be exposed to temperature variations that are different from those of the substrate/die. The small temperature variations of the device result in variations of the I-V (current-voltage) characteristic of the transistor itself, which can be detected appropriately. For example, the variation in temperature of the transistor may be due to infrared (IR) radiation impinging on the TMOS itself, or else may be due to the flow of a gas on the TMOS itself. Such a TMOS device is hence frequently referred to as "thermally isolated MOS" (owing to the thermal isolation of the MOS) or simply as "thermal MOS" (owing to its capacity for detecting temperature variations).

For example, sensors of this type are described in the documents United States Patent Application Publication Nos. 2006/0244067, 2011/0315880, and 2017/0205366, which are incorporated herein by reference. For instance, such a suspended MOS transistor may be manufactured using an appropriate process of micro-machining and dry etching with a traditional CMOS-SOI or SOI-CMOS (Silicon-On-Insulator Complementary-Metal-Oxide Semiconductor) process.

The TMOS is an element useful for developing new-generation sensing devices, such as infrared (IR) temperature sensors, anti-intrusion sensors, gas-flow sensors, etc. Use of the TMOS transistor as active sensitive element presents advantages in terms of internal gain, multiplexing within the sensor, and high temperature sensitivity. Since the TMOS can be used in sub-threshold conditions, with a very low power consumption, it can be supplied by a battery, enabling a wide range of applications in the sectors of mobile phones, smart home, IoT (Internet of Things), and safety and security.

As described in United States Patent Application Publication No. 2017/0205366, TMOS sensors are to be appropriately biased, and then the small signal produced by the sensor (due to the variation of temperature that is set up at the TMOS itself) is to be amplified and post-processed.

Hence, the design of a reading circuit architecture is fundamental for detecting appropriately the signal produced by a TMOS sensor.

There is accordingly a need in the art to provide approaches that will be able to overcome one or more of the limits of conventional technology.

SUMMARY

According to one or more embodiments, one or more of the above objects are achieved by an amplification interface. The embodiments moreover concern a corresponding measurement system and a method for calibrating an amplification interface.

Various embodiments of the present disclosure regard an amplification interface for a first FET and a second FET, such as MOS transistors, preferably n-channel MOS transistors. In particular, in various embodiments, these transistors are TMOS transistors, in which the gate terminals are connected to a reference voltage. In various embodiments, the amplification interface hence includes a first node, a second node, and a third node, where the drain terminal of the first FET is connected to the first node, the drain terminal of the second FET is connected to the second node, and the source terminals of the first and second FETs are connected to the third node.

In various embodiments, a first bias-current generator generates a first bias current, and the output of the first bias-current generator is connected to the first node. Moreover, a second bias-current generator generates a second bias current, and the output of the second bias-current generator is connected to the second node. In various embodiments, the first and second bias-current generators are current generators of a PTAT (Proportional To Absolute Temperature) type.

In various embodiments, the amplification interface includes a third FET, where the drain terminal of the third FET is connected to the third node, and the source terminal of the third FET is connected to a reference voltage. A regulation circuit is configured for driving the gate terminal of the third FET in such a way as to regulate the common mode of the voltage at the first node and of the voltage at the second node on a required value.

In various embodiments, the amplification interface includes a differential current integrator, which includes a first input terminal connected to the second node and a second input terminal connected to the first node. The differential integrator hence supplies at its output, via two output terminals, a voltage representing the integral of the difference between the current received at the second input terminal of the differential current integrator and the current received at the first input terminal of the differential current integrator.

For example, in various embodiments, the differential current integrator includes a differential operational amplifier, where a first input terminal of the differential operational amplifier is connected to the second node, and a second input terminal of the differential operational amplifier is connected to the first node. Moreover, a first capacitor is connected between a first output terminal of the differential operational amplifier and the first input terminal of the differential operational amplifier, and a second capacitor is connected between a second output terminal of the differential operational amplifier and the second input terminal of the differential operational amplifier. In various embodiments, the differential current integrator also has a first electronic switch and a second electronic switch connected in parallel to the first and second capacitors, respectively, where the first and second electronic switches are driven by means of a reset signal, thus enabling a reset of the differential current integrator.

In various embodiments, the amplification interface may include a sample-and-hold circuit, which stores the output voltage of the differential current integrator as a function of a control signal.

A control circuit can hence generate the reset signal in such a way that the differential current integrator is periodically reset during a reset interval and activated during a measurement interval. Moreover, the control circuit, during each measurement interval, can set the control signal at a first logic value for storing the output voltage for a sampling interval and set the control signal at a second logic value for keeping the output voltage stored for a hold interval.

In various embodiments, the amplification interface further includes an RC oscillator, including a capacitor and a resistor, which define an oscillation period of the RC oscillator, and the control circuit can generate the control signal in such a way that the sampling interval corresponds to a multiple of the oscillation period of the RC oscillator.

In this case, by designing in an appropriate way the first and second bias-current generators (which are generators of a proportional to absolute temperature (PTAT) type), the (integration) capacitors of the differential current integrator, and the capacitor and the resistor of the RC oscillator, the process spread and the temperature variations of these components can be compensated.

Disclosed herein is an electronic device, including: a thermally-isolated metal-oxide semiconducting (TMOS) sensor having a first current input terminal coupled to a first node to receive a first bias current, a second current input terminal coupled to a second node to receive a second bias current, and a current output terminal coupled to a third node; a tail transistor having a first conduction terminal coupled to the third node, a second conduction terminal coupled to a reference voltage, and a control terminal; a control circuit configured to generating a control signal applied to the control terminal of the tail transistor based upon voltages at the first and second nodes so that a common mode of the voltages at the first and second nodes are equal to a reference common mode voltage; and a differential current integrator comprising a first input terminal coupled to the second node and a second input terminal coupled to the first node, wherein the differential current integrator is configured to provide an output voltage indicative of an integral of a difference between a first output current at the first input terminal and a second output current received at the second input terminal.

The TMOS sensor may include: a first thermally-isolated metal-oxide semiconducting (TMOS) transistor having a drain coupled to the first node, a source coupled to the third node, and a gate; and a second thermally-isolated metal-oxide semiconducting (TMOS) transistor having a drain coupled to the second node, a source coupled to the third node, and a gate coupled to the gate of the first TMOS transistor.

The first and second TMOS transistors may be configured to operate in a subthreshold region.

The first and second TMOS transistors may be sized with a width to length ratio such that gate to source voltages thereof are less than threshold voltages of the first and second TMOS transistors.

The first and second bias currents may be equal.

The first and second TMOS transistors may form an amplifier having a voltage offset, and a current generator may be configured to apply correction currents to the first and second nodes that compensate for the voltage offset.

A current generator may be configured to apply a first correction current to the first node and a second correction current to the second node.

The first and second correction currents may be equal in magnitude but opposite in sign.

A magnitude of the first and second bias currents may be proportional to absolute temperature.

The differential current integrator may include: a differential operational amplifier; a first capacitor connected between a first output terminal of the differential operational amplifier and the first input terminal; a second capacitor connected between a second output terminal of the differential operational amplifier and the second input terminal; first and second electronic switches respectively connected in parallel with the first and second capacitors, wherein the first and second electronic switches are driven via a reset signal; and a control circuit. The control circuit may be configured to: generate the reset signal, such that the differential current integrator is periodically reset during a reset interval and activated during a measurement interval; and during each measurement interval, set the control signal to the a logic value for a sampling interval and set the control signal to a second logic value for a hold interval. An RC oscillator may have a capacitor and a resistor which define an oscillation period of the RC oscillator, and wherein the control circuit is configured to generate the control signal such that the sampling interval corresponds to a multiple of the oscillation period of the RC oscillator.

The control circuit may be configured to generate the control signal such that the sampling interval corresponds to a multiple of the oscillation period of the RC oscillator.

First and second current sources may generate the first and second bias currents. The first and second current generators, and the RC oscillator, may be collectively configured such that a magnitude of the first bias current multiplied by a frequency of the RC oscillator remains constant over temperature, and such that a magnitude of the second bias current multiplied by the frequency of the RC oscillator remains constant over temperature.

A first chopper circuit may be connected between the first and second input terminal of the differential current integrator, and the first and the second nodes. A second chopper circuit may be connected between the first current generator and the second current generator, and the first and the second nodes. A third chopper circuit may be connected between the two output terminals of the differential current integrator and two output terminals.

An analog to digital converter (ADC) may have inputs coupled to the first and second outputs of the differential operational amplifier.

A chopper circuit may be coupled between the first and second outputs of the differential operational amplifier and the inputs of the ADC.

A processing circuit may be configured to process digital samples produced by the ADC.

The processing circuit may be configured to act as moving-average filter that receives digital samples produced by the ADC and produces an output signal at a sampling frequency of the ADC, with each sample of the output signal representing an average of a given number of prior digital samples produced by the ADC.

Also disclosed herein is an electronic device, including: a sensor having a first current input terminal coupled to a first node to receive a first bias current, a second current input terminal coupled to a second node to receive a second bias current, and a current output terminal coupled to a third node; a tail transistor having a first conduction terminal coupled to the third node, a second conduction terminal coupled to a reference voltage, and a control terminal; a control circuit configured to generating a control signal applied to the control terminal of the tail transistor based upon voltages at the first and second nodes; and a differential current integrator comprising a first input terminal coupled to the second node and a second input terminal coupled to the first node.

The sensor may include: a first transistor having a drain coupled to the first node, a source coupled to the third node, and a gate; and a second transistor having a drain coupled to the second node, a source coupled to the third node, and a gate coupled to the gate of the first transistor.

The first and second transistors may be configured to operate in a subthreshold region.

The first and second transistors may be sized with a width to length ratio such that gate to source voltages thereof are less than threshold voltages of the first and second transistors.

The first and second bias currents may be equal.

The first and second transistors may form an amplifier having a voltage offset, and a current generator may be configured to apply correction currents to the first and second nodes that compensates for the voltage offset.

A current generator may be configured to apply a first correction current to the first node and a second correction current to the second node.

The first and second correction currents may be equal in magnitude but opposite in sign.

A magnitude of the first and second bias currents may be proportional to absolute temperature.

BRIEF DESCRIPTION OF THE DRAWINGS

The embodiments of the present disclosure will now be described with reference to the annexed plates of drawings, which are provided purely to way of non-limiting example and in which.

DETAILED DESCRIPTION

In the ensuing description, various specific details are illustrated aimed at enabling an in-depth understanding of the embodiments. The embodiments may be provided without one or more of the specific details, or with other methods, components, materials, etc. In other cases, known structures, materials, or operations are not shown or described in detail so that various aspects of the embodiments will not be obscured.

Reference to "an embodiment" or "one embodiment" in the framework of this description is meant to indicate that a particular configuration, structure, or characteristic described in relation to the embodiment is comprised in at least one embodiment. Hence, phrases such as "in an embodiment", "in one embodiment", or the like that may be present in various points of this description do not necessarily refer to one and the same embodiment. Moreover, particular conformations, structures, or characteristics may be combined in any adequate way in one or more embodiments.

The references used herein are only provided for convenience and hence do not define the sphere of protection or the scope of the embodiments.

Figure 1:
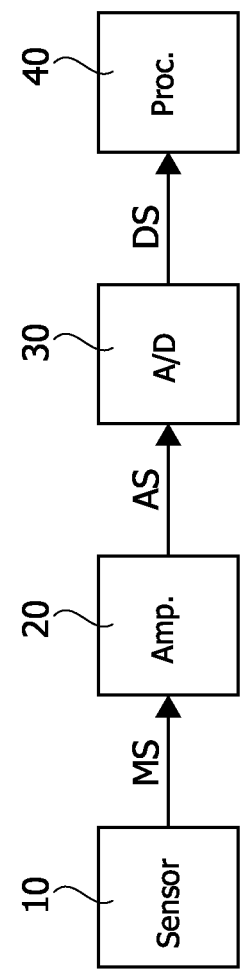
FIG. 1 shows a measurement system.

In FIGS. 2 to 7 described below, parts, elements or components that have already been described with reference to FIG. 1 are designated by the same references used previously in these figures. The description of these elements has already been made and will not be repeated in what follows in order not to burden the present detailed description.

As explained previously, various embodiments of the present description regard an electronic amplification interface devised for "reading" the signal produced by TMOS sensors.

Figure 2:
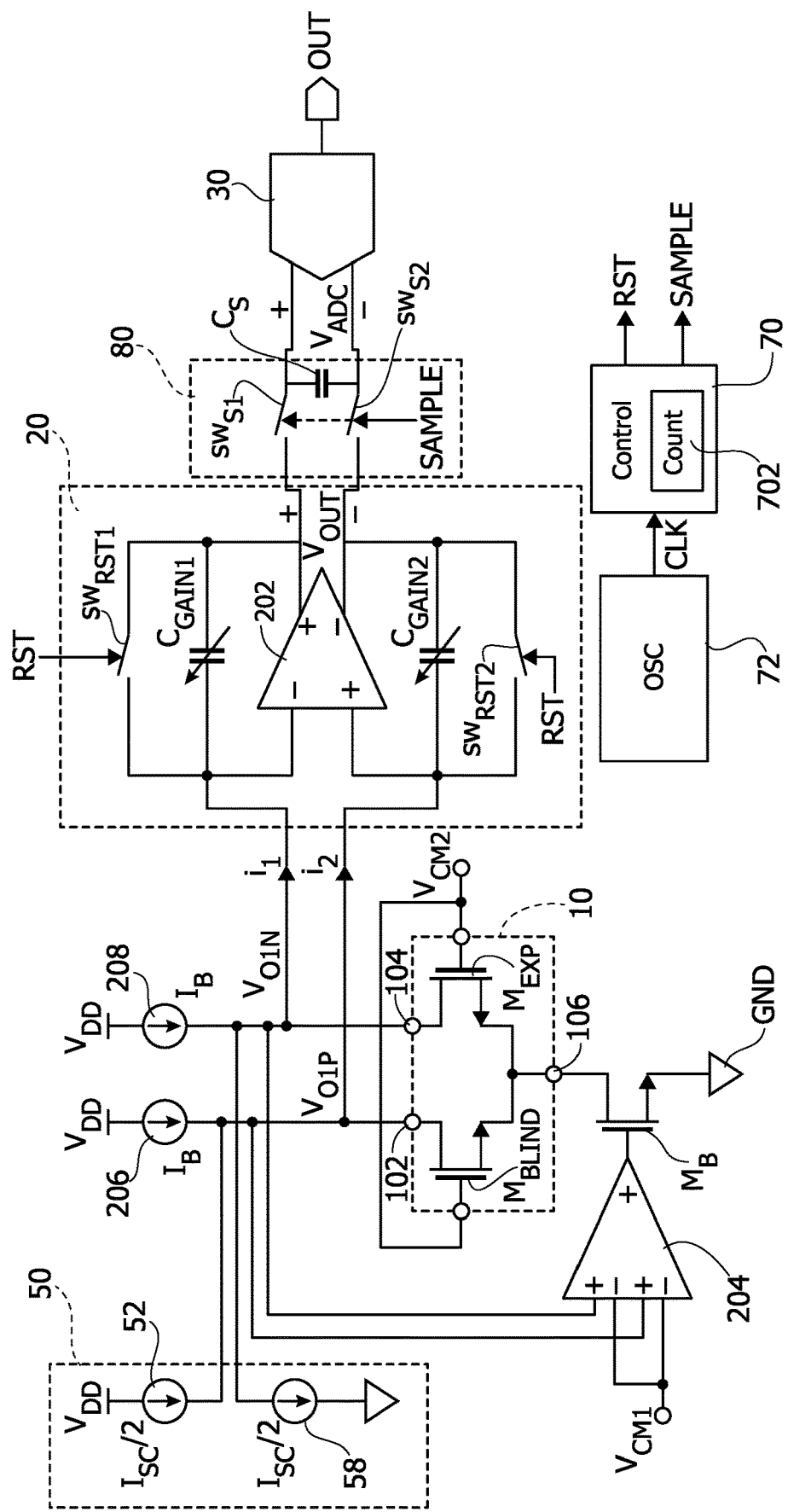
FIG. 2 shows a first embodiment of an amplification interface.

FIG. 2 shows a first embodiment of a measurement system comprising a TMOS sensor 10, an electronic amplification interface, and an optional analog-to-digital converter 30.

In particular, in the embodiment, the TMOS sensor 10 comprises two TMOS transistors $M_{BLIND}$ and $M_{EXP}$. In the embodiment considered, these transistors are FETs (Field-Effect Transistors), for example of the n-channel type.

In various embodiments, these two TMOS transistors are provided within one and the same integrated circuit/die and have the same characteristics, in particular with reference to sizing of the transistors; i.e., the transistor $M_{BLIND}$ is substantially a copy of the transistor $M_{EXP}$. Preferably, the TMOS transistors $M_{BLIND}$ and $M_{EXP}$ are positioned in the proximity of one another.

In the embodiment considered, the electronic amplification interface is configured for amplifying the differential signal between the two transistors, for example the differential signal between the drain terminals of the transistors $M_{BLIND}$ and $M_{EXP}$. For example, as will be described hereinafter, this enables rejection of the common-mode signals and of disturbance that arrive at both of the transistors of the TMOS sensor.

In the embodiment considered, the differential signal results from the fact that the TMOS transistor $M_{EXP}$ is "exposed", i.e., it is configured for being exposed to the variation of temperature that the quantity to be measured produces thereon, whereas the other TMOS transistor $M_{BLIND}$ is "blind", i.e., it is configured in such a way that the physical quantity that is to be measured does not produce any effect thereon.

For example, in various embodiments, the quantity that is to be measured is the infrared radiation produced by an object set at a distance from the TMOS sensor 10. Infrared radiation is a function of the temperature of the object itself. Hence, the measurement of the infrared radiation emitted by an object enables an indirect measurement of the temperature of the object. In this case, the transistor $M_{BLIND}$ is hence shielded from the IR radiation, whereas the transistor $M_{EXP}$ is configured for receiving the IR radiation produced by the object. Consequently, the power of the IR radiation received by the transistor $M_{EXP}$ will cause slight heating of the transistor $M_{EXP}$ (and not of the transistor $M_{BLIND}$). This difference in temperature hence generates a variation in the differential signal across the sensor 10 that the amplification interface should amplify. In fact, in general, a small variation in temperature of the transistor $M_{EXP}$ causes a small displacement within the I-V characteristic of the transistor $M_{EXP}$, which in turn generates a small variation in the differential signal between the transistors $M_{BLIND}$ and $M_{EXP}$.

Consequently, in general, the variation of temperature of the transistor $M_{EXP}$ (and not of the transistor $M_{BLIND}$) that the physical quantity to be measured (IR radiation, gas flow, etc.) produces results in a variation of the electrical characteristics of the transistor $M_{EXP}$ (and not of the transistor $M_{BLIND}$), which in turn results in a variation of the differential signal that the amplification interface should amplify. Instead, the amplification interface may be configured in such a way that the common-mode variations on the transistors $M_{EXP}$ and $M_{EXP}$ (for example, the variation of the ambient temperature, and in general any common-mode disturbance) will not produce any variation of the differential signal and hence their effect is filtered/compensated.

Even though the present description has been conceived and devised for amplifying as well as possible the signal generated by a TMOS sensor 10, the electronic amplification interface proposed is functional and suitable also in the case where, instead of the TMOS transistors, two MOS transistors are used, since the amplification interface is configured for amplifying a differential signal between two transistors, such as a differential signal on the drain terminals of two n-channel transistors.

As explained previously, the electronic amplification interface may amplify the differential signal between the two transistors $M_{BLIND}$ and $M_{EXP}$. To generate such a differential signal, a circuit which generates an appropriate biasing of the transistors $M_{BLIND}$ and $M_{EXP}$ is utilized.

For example, in the embodiment considered, the electronic amplification interface comprises for this purpose two current generators 206 and 208. In particular, the current generator 206 is connected in series with the drain and source terminals of the transistor $M_{BLIND}$, and the current generator 208 is connected in series with the drain and source terminals of the transistor $M_{EXP}$.

For instance, in the embodiment considered, the transistors $M_{BLIND}$ and $M_{EXP}$ are n-channel transistors. In this case, as also described in United States Patent Application Publication No. 2017/0205366, the current generator 206 may be connected (for example, directly) between the drain terminal of the transistor $M_{BLIND}$ and a reference voltage $V_{DD}$, which, for example, corresponds to the supply voltage of the integrated circuit and/or of the processing circuit 40 shown in FIG. 1. Likewise, the current generator 208 may be connected (for example, directly) between the drain terminal of the transistor $M_{EXP}$ and the reference voltage $V_{DD}$.

In the embodiment considered, the gate terminal of the transistor $M_{BLIND}$ is connected (for example, directly) to the gate terminal of the transistor $M_{EXP}$, which in turn is connected (for example, directly) to a reference voltage $V_{CM2}$. In general, when instead of the TMOS transistors two normal transistors are used, the input signal may be applied between the gate terminals of the transistors $M_{BLIND}$ and $M_{EXP}$.

However, whereas according to the teachings of United States Patent Application Publication No. 2017/0205366 the source terminals of the transistors $M_{BLIND}$ and $M_{EXP}$ were directly connected to ground, the embodiment represented in FIG. 2 also comprises a common-mode control circuit. In particular, in the embodiment considered, the source terminal of the transistor $M_{BLIND}$ is connected (for example, directly) to the source terminal of the transistor $M_{EXP}$, which in turn is connected (for example, directly) by means of a transistor $M_B$ to a reference voltage, for example, ground GND. Considering that, in the embodiment considered, the TMOS transistors are of the n-channel type, preferably also the transistor $M_B$ is of the n-channel type. In the embodiment considered, the drain terminal of the transistor $M_B$ is hence connected (for example, directly) to the source terminal of the transistor $M_{BLIND}$/source terminal of the transistor $M_{EXP}$, i.e., the terminal 106, and the source terminal of the transistor $M_B$ is connected (for example, directly) to the reference voltage/GND.

Consequently, in the embodiment considered, the sensor 10 is connected to the amplification interface by three terminals:

a terminal 102 that corresponds to the drain terminal of the transistor $M_{BLIND}$;

a terminal 104 that corresponds to the drain terminal of the transistor $M_{EXP}$, and a terminal 106 that corresponds to the source terminals of the transistors $M_{BLIND}$ and $M_{EXP}$.

In various embodiments, each of the current generators 206 and 208 supplies a current $I_B$. For example, the current generators 206 and 208 may be implemented with a current mirror. Consequently, in the embodiment considered, the bias current of the transistor $M_{EXP}$ and of the transistor $M_{BLIND}$ is substantially equal to IB, whereas the current of the transistor $M_B$ is substantially equal to $2 \cdot I_B$.

This part of the circuit hence basically corresponds to an OTA (Operational Transconductance Amplifier) as described, for example, in U.S. Pat. No. 6,693,485, the contents of which are incorporated herein by reference.

However, in the embodiment considered, the gate terminal of the transistor $M_B$ is not driven by a constant signal, but by a control circuit 204. In particular, the aforesaid control circuit 204 is configured for monitoring the voltage $V_{O1P}$ on the drain terminal of the transistor $M_{BLIND}$ and the voltage $V_{O1N}$ on the drain terminal of the transistor $M_{EXP}$, and for generating the driving signal for the gate terminal of the transistor $M_B$ as a function of these voltages. In particular, in the embodiment considered, the control circuit 204 is configured for controlling (by feedback of the voltages $V_{O1P}$ and $V_{O1N}$) the voltage on the gate of the transistor $M_B$ so that the common mode of the voltages $V_{O1P}$ and $V_{O1N}$ will be equal to a reference voltage $V_{CM1}$, i.e., the control circuit 204 is configured for regulating the gate-to-source voltage $V_{CM1}$ of the transistor $M_B$ in such a way that:

$$(V_{O1P}+V_{O1N})/2=V_{CM1}$$

For example, in various embodiments, the control circuit 204 may be implemented with a regulator that comprises at least one I (Integral) component and possibly a P (Proportional) component. For instance, the control circuit 204 may be implemented by one or more operational amplifiers.

In various embodiments, the amplification interface is configured in such a way that the transistors $M_{BLIND}$ and $M_{EXP}$ are biased so as to work in the sub-threshold region. For example, once the bias current of the transistors $M_{EXP}$ and $M_{BLIND}$ has been fixed equal to $I_B$, these transistors can be sized with a (width-to-length W/L) ratio sufficiently high to help guarantee that the voltage between the gate and source terminals $V_{GS}$ will be lower than the threshold voltage $V_T$ of the transistors; i.e., $V_{GS}<V_T$.

There now follows an analysis of the effect of temperature T of the TMOS transistors on the differential signal. In particular, assuming that the transistors $M_{BLIND}$ and $M_{EXP}$ are biased in sub-threshold conditions, the current on the drain terminal $I_D$ may be modelled, for example, using the model described by Clifton Fonstad, "MOSFETs in the Sub-threshold Region (i.e. a bit below VT)", 10/28/09 (the contents of which are hereby incorporated by reference), in particular Eq. (29) appearing therein:

$$I_D = \frac{W}{L} \cdot \mu_e \cdot C_{ox} \cdot (n-1) \cdot \phi_t^2 \cdot e^{\frac{V_{GS}-V_T}{n\phi_t}} \cdot \left(1 - e^{-\frac{V_{DS}}{\phi_t}}\right) \quad (1)$$

For a definition of the parameters of Eq. (1) reference may be made to the document cited. In particular, the inventors have noted that the following parameters of the equation depend upon the temperature T of the transistor: $\mu_e$, which represents the electron mobility, and $V_T$, which is the threshold voltage of the transistor.

In various embodiments, the voltages $V_{CM1}$ and $V_{CM2}$ are chosen in such a way that the voltages between the drain and source terminals $V_{DS}$ of the transistors $M_{BLIND}$ and $M_{EXP}$ are high with respect to the thermal voltage $\phi_t$, for example $V_{DS}>3\phi_t$. In this case, Eq. (1) simplifies to $$I_D = \frac{W}{L} \cdot \mu_e \cdot C_{ox} \cdot (n-1) \cdot \phi_t^2 \cdot e^{\frac{V_{GS}-V_T}{n\phi_t}} \quad (2)$$

Moreover, substituting the thermal voltage $\phi_t$ with $kT/q$ and assuming that the mobility $\mu_e$ of the transistors can be approximated by $$\mu_e(T) \cong \mu_{e0}\left(\frac{T_0}{T}\right)^2 \quad (3)$$

where $\mu_{e0}$ and $T_0$ are two constants, the current $I_D$ of the transistors can be written as follows:

$$I_D \cong \frac{W}{L} \cdot \mu_{e0}\left(\frac{T_0}{T}\right)^2 \cdot C_{ox} \cdot (n-1) \cdot \left(\frac{kT}{q}\right)^2 \cdot e^{\frac{V_{GS}-V_T(T)}{n\frac{kT}{q}}} \quad (4)$$

i.e., $$I_D = \frac{W}{L} \cdot \mu_{e0}\left(\frac{kT_0}{q}\right)^2 \cdot C_{ox} \cdot (n-1) \cdot e^{\frac{q}{nkT}(V_{GS}-V_T(T))} = I_{D0} \cdot e^{\frac{q}{nkT}(V_{GS}-V_T(T))} \quad (5)$$

where $I_{D0}$ is a constant.

In the ensuing treatment, the difference in temperature between the two TMOS transistors, which gives rise to the differential signal, will be denoted as $$\Delta T_{TMOS} = T_{M_{EXP}} - T_{M_{BLIND}}. \quad (6)$$

The variation of the current of the TMOS transistors caused by a small variation of temperature of the transistor itself can hence be evaluated by computing the derivative with respect to the temperature of Eq. (5) and then multiplying the result by the difference $\Delta T_{TMOS}$. Differentiating Eq. (5) we obtain $$\frac{d\,I_D}{dT} = I_{D0} \cdot e^{\frac{q}{nkT}(V_{GS}-V_T(T))} \cdot \frac{d}{dT}\left(\frac{q}{nkT}(V_{GS}-V_T(T))\right) = \quad (7)$$

$$I_D \cdot \frac{q}{nkT}\left[\frac{V_{GS}-V_T(T)}{T} - \frac{d\,V_T(T)}{dT}\right] = g_m(T) \cdot \alpha_{VGS}(T)$$

where the factor $(I_D q)/(nkT)$ is the small-signal transconductance of the TMOS transistors, which is denoted by $g_m$.

Considering that in the solution proposed $I_D \approx I_B$, we have $$g_m = \frac{d\,I_D}{d\,V_{GS}} = \frac{I_D}{n\frac{kT}{q}} \cong \frac{I_B}{n\phi_t} \quad (8)$$

The multiplying factor $\alpha_{VGS}(T)$ $$\alpha_{VGS}(T) = \left[\frac{V_{GS}-V_T(T)}{T} - \frac{d\,V_T(T)}{dT}\right]$$

can be considered equal to $$\alpha_{VGS}(T) = \frac{d\,V_{GS}}{dT} \quad (9)$$

since $$\alpha_{VGS}(T)\frac{d\,I_D}{dV_{GS}} = \frac{d\,I_D}{dT}$$

i.e., $\alpha_{VGS}(T)$ represents the non-normalized temperature coefficient of the voltage $V_{GS}$ of the transistors.

The inventors have noted that, for typical values, the term $\alpha_{VGS}(T)$ has little effect on the temperature variation. In fact, by rendering $g_m(T)$ substantially independent of the temperature, also the term $g_m(T) \cdot \alpha_{VGS}(T)$ will likewise be a good approximation independent of the temperature.

In general, the current of the TMOS transistors can hence be written as the sum of a biasing value plus a small-signal value:

$$I_{D,EXP} = I_B + i_{SIG\_EXP} \quad (10)$$

$$I_{D,BLIND} = I_B + i_{SIG\_BLIND} \quad (11)$$

where the small-signal contribution is the one due to a small temperature variation that is obtained on the TMOS transistors $M_{EXP}$ and $M_{BLIND}$, respectively:

$$i_{SIG\_EXP} \cong \frac{d\,I_D}{dT}\bigg|_{T_{amb}} \cdot \Delta T_{M_{EXP}} = \frac{I_B}{n\phi_t} \cdot \alpha_{VGS}(T)(T_{M_{EXP}} - T_{amb}) \quad (12)$$

$$i_{SIG\_BLIND} \cong \frac{d\,I_D}{dT}\bigg|_{T_{amb}} \cdot \Delta T_{M_{BLIND}} = \frac{I_B}{n\phi_t} \cdot \alpha_{VGS}(T)(T_{M_{BLIND}} - T_{amb}) \quad (13)$$

In the embodiment considered, the amplifier circuit hence does not amplify the voltage difference between the drain terminals of the transistors $M_{BLIND}$ and $M_{EXP}$, but the circuit amplifies a current $i_S$ that corresponds to the difference of the currents in Eqs. (12) and (13).

For this purpose, the drain terminal of the transistor $M_{BLIND}$ and the drain terminal of the transistor $M_{EXP}$ are connected to a differential current integrator 20. In particular, the circuit 20 comprises two input terminals, one of which receives a first current $i_1$ and the other a second current $i_2$. Moreover, the circuit 20 is configured for generating an output signal, such as a voltage $V_{out}$, which is proportional to the integral of the difference between the currents $i_2$ and $i_1$.

For example, in the embodiment considered, the circuit 20 is implemented with a single operational amplifier 202, such as an OTA. However, in general, the circuit 20 could also comprise a plurality of operational amplifiers.

In particular, in the embodiment considered, a first input terminal of the operational amplifier 202 (typically, the negative terminal) is connected (for example, directly) to the drain terminal of the transistor $M_{EXP}$, i.e., the terminal 104, and hence receives the current A second input terminal of the operational amplifier 202 (typically, the positive terminal) is connected (for example, directly) to the drain terminal of the transistor $M_{BLIND}$, i.e., the terminal 102, and hence receives the current $i_2$. A first terminal of the differential output of the operational amplifier 202 (typically, the positive output terminal) is connected by a first feedback network to the first input terminal of the operational amplifier 202, and a second output terminal of the operational amplifier 202 (typically, the negative output terminal) is connected by a second feedback network to the first input terminal of the operational amplifier 202. In particular, the first and second feedback networks comprise, respectively, at least one integration capacitor. For example, in the embodiment considered, a capacitor $C_{GAIN1}$ is connected (for example, directly) between the first output terminal and the first input terminal, and a capacitor $C_{GAIN2}$ is connected (for example, directly) between the second output terminal and the second input terminal.

Consequently, in the embodiment considered, the current $i_1$ charges the capacitor $C_{GAIN1}$, the current $i_2$ charges the capacitor $C_{GAIN2}$, and the output voltage corresponds to the difference of the voltages across the capacitors $C_{GAIN1}$ and $C_{GAIN2}$. Hence, considering the inverting configuration shown in FIG. 2, the amplifier 20 is configured for amplifying a current $i_S = i_2 - i_1$.

Consequently, considering also Eqs. (10) and (11), in various embodiments, the amplifier circuit 20 receives at input a current $$i_S = i_{SIG\_EXP} - i_{SIG\_BLIND} \quad (14)$$

In various embodiments, the amplification interface may also comprise a current generator 50, which supplies an additional compensation current $i_{SC}$ at input to the integrator 20. For example, in the embodiment considered, the current generator 50 comprises a first current generator 52, which supplies a current $I_{SC}/2$ to the first input terminal of the integrator circuit 20 and a second current generator 58, which supplies a current $-I_{SC}/2$ to the second input terminal of the integrator circuit 20.

Consequently, in various embodiments, the amplifier circuit 20 receives at input a current $$i_S = i_{SIG\_EXP} - i_{SIG_{BLIND}} + I_{SC} \quad (15)$$

Hence, considering also Eqs. (12) and (13), the current $i_S$ corresponds to $$i_S = \frac{I_B}{n\phi_t} \cdot \alpha_{VGS}(T_{amb})\Delta T_{TMOS} + I_{SC} \quad (16)$$

The optional current $I_{SC}$ (as will be described in greater detail hereinafter) substantially makes it possible to carry out an offset correction in the output signal $V_{out}$. Such an offset correction of the output may be useful for correcting any possible leakage or undesired signals that might lead the circuit 20 and/or the A/D converter 30 to exit from the dynamic range of proper operation.

The current $i_S$ according to Eq. (14) or Eq. (16) is then supplied at input to the integrator circuit 20, and the integrator circuit 20 is configured for generating an output signal representing the integral of the current $i_S$.

For enabling a correct measurement of the current $i_S$, the integrator circuit 20 further comprises a reset circuit, configured for selectively discharging the capacitors $C_{GAIN1}$ and $C_{GAIN2}$. For example, in the embodiment considered, the reset circuit is implemented with a first electronic switch $SW_{RST1}$ connected in parallel to the capacitor $C_{GAIN1}$ and a second electronic switch $SW_{RST2}$ connected in parallel to the capacitor $C_{GAIN2}$.

In various embodiments, the amplification interface may also comprise a sample-and-hold circuit 80. In particular, this circuit 80 represents an analog memory configured for storing the value of the voltage $V_{out}$ at output from the integrator 20 as a function of a control signal SAMPLE. For example, in the simplest case, such a circuit 80 may be implemented with a capacitor $C_S$ that is selectively connected, for instance through one or more electronic switches, to the voltage $V_{out}$ as a function of the signal SAMPLE. For example, FIG. 2 represents schematically two switches $SW_{S1}$ and $SW_{S2}$. The capacitor $C_S$ may even correspond to the input capacitance of the A/D converter 30.

For example, in the embodiment considered, the reset signal RST and the signal SAMPLE are generated by a single control circuit 70, which sets the reset signal RST for a first time interval $T_1$ at a first logic level (typically high), for resetting the analog integrator, and for a second time interval $T_2$ at a second logic level (typically low), for activating the analog integrator 20. Consequently, the duration $T_2$ represents a measurement interval that corresponds to the integration period used by the analog integrator 20. In various embodiments, the time intervals $T_1$ and $T_2$ are constant.

In general, on the basis of the implementation of the circuit 80, the signal SAMPLE may also correspond to the reset signal RST or to its inverted version. However, preferably, the control circuit 70 is configured for generating the signal SAMPLE so as to guarantee sampling of the voltage $V_{out}$ through the circuit 80 before the reset signal RST is set for discharging the capacitors $C_{GAIN1}$ and $C_{GAIN2}$. For example, in the embodiment considered, discharge starts upon switching of the signal RST from the second logic level (low) to the first level (high), and the signal SAMPLE is set to a low logic value after an interval $T_4$, which is shorter than the interval $T_2$, i.e., $T_4 < T_2$.

For instance, in various embodiments, the control circuit 70 generates the reset signal RST using a counter/timer 702 configured for incrementing a count value as a function of a clock signal CLK and for setting the logic level of the reset signal RST by comparing the count value with at least one first threshold that identifies the duration of the measurement interval $T_2$. Likewise, the control circuit 70 can set the logic level of the signal SAMPLE by comparing the count value with at least one second threshold that identifies the duration of the interval $T_4$. Hence, in various embodiments, the control circuit 70 is configured for generating the signals RST and SAMPLE synchronously with the clock signal CLK, which has a given oscillation frequency $f_{OSC}$; i.e., the time intervals during which these signals are set at "0" or else at "1" are a given multiple of the oscillation period $1/f_{OSC}$.

As shown schematically in FIG. 2, such a clock signal CLK can be supplied by an appropriate oscillator 72. In particular, as will be described in greater detail hereinafter, the oscillator 72 may be an oscillator that comprises at least one RC element, which defines the oscillation frequency $f_{OSC}$ of the oscillator 72.

Figure 3:
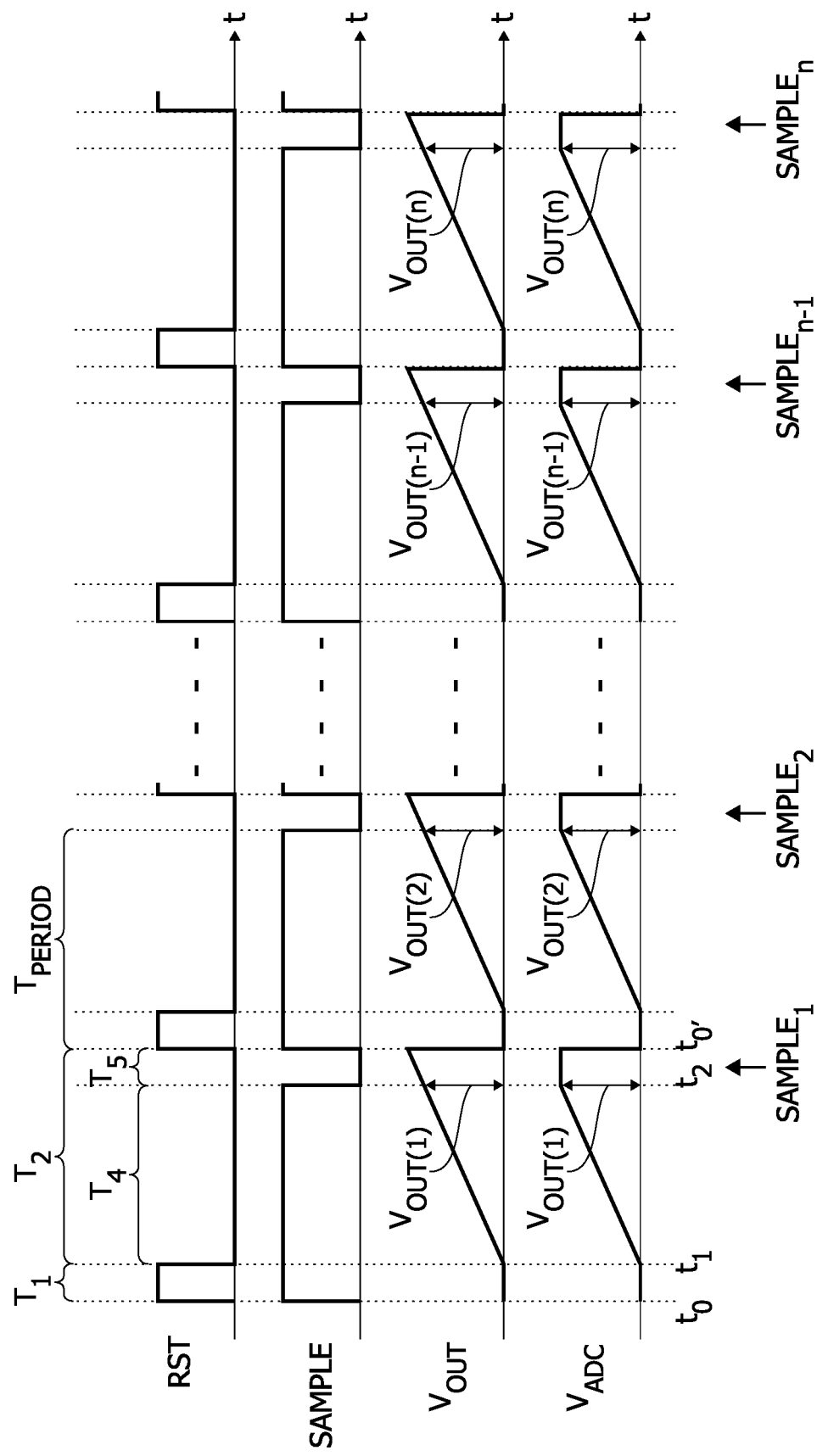
FIG. 3 shows an embodiment of operation of the amplification interface of FIG. 2.

A possible operation of the control circuit 70 and of the integrator circuit 20 is shown in FIG. 3. In particular, as explained previously, the control circuit 70 generates the reset signal RST; in particular, the control circuit 70 is configured for repeating periodically the following operations:

at an instant $t_0$, the signal RST is set at a first logic level (high) for resetting the analog integrator 20; and at an instant $t_1$, the signal RST is set at a second logic level (low), thus determining the end of the reset step, i.e., the start of the integration step.

Consequently, the time interval between the instants $t_0$ and $t_1$ corresponds to the reset interval $T_1$, whereas the time interval between the instant $t_1$ and the next instant $t_0'$ corresponds to the measurement interval $T_2$.

In the embodiment considered, an example of the signal SAMPLE is also shown. In particular, as explained previously, the signal SAMPLE stores the value of the voltage $V_{out}$ before the analog integrator 20 is reset.

For instance, for this purpose, the signal SAMPLE can be set with respect to start of the measurement interval $T_2$ (i.e., with respect to the instant $t_1$) for a sample time $T_4$ at a first logic value, during which the circuit 80 stores the value of the signal $V_{out}$, and for a hold time $T_5 = T_2 - T_4$ it does not store the value of the signal $V_{out}$ and holds the value stored at the end of the interval $T_4$. Consequently, for enabling a comparison of different measured values, the duration of the measurement interval $T_2$ is not particularly important, but the time $T_4$ should be constant.

For example, in the embodiment considered, when the signal SAMPLE is "1" (high logic level), the differential voltage $V_{ADC}$, which in the embodiment considered corresponds to the voltage on the capacitance $C_S$ (additional capacitor and/or input capacitance of the A/D converter 30), corresponds to the voltage $V_{out}$. At the instant $t_2$, i.e., when the signal SAMPLE is set at "0" (low logic level) the capacitance $C_S$ is disconnected from the output of the integrator 20, and the voltage $V_{ADC}$ remains fixed at the last voltage value assumed at the instant $t_2$ thanks to the memory function of the capacitance $C_S$. From the instant $t_2$ up to the next instant $t_0'$ (when the signal RESET goes to "1" cancelling out the differential signal $V_{out}$, and the signal SAMPLE goes to "1" bringing the voltage $V_{ADC}$ to the value $V_{out}$) the voltage $V_{ADC}$ remains fixed at the value that is to be sampled. Hence, between the instants $t_2$ and $t_0'$ the A/D converter 30 receives at input a fixed analog signal and can carry out a digital conversion of this analog level.

As explained previously, in various embodiments, the reset time $T_1$, the sample time $T_4$, and the hold time $T_5$ can be determined by means of an oscillator and a counter 702 and may hence correspond to $$T_1 = N_R/f_{OSC} \tag{17}$$

$$T_4 = N_S/f_{OSC} \tag{18}$$

$$T_5 = N_H/f_{OSC} \tag{19}$$

In various embodiments, the values $N_R$, $N_S$, and $N_H$ are integers and may optionally also be programmable.

Consequently, the amplification interface shown in FIG. 3 enables acquisition/sampling during each hold interval $T_5$ through the A/D converter 30 of one or more respective samples of the voltage $V_{out}$ at the instant $t_2$ of the respective sampling period $T_{PERIOD} = T_1 + T_4 + T_5$. For example, in FIG. 3, the processing circuit 40 can acquire through the A/D converter 30 a sequence of n samples $SAMPLE_1$, $SAMPLE_2$, . . . , $SAMPLE_n$ that represent, respectively, for the voltages $V_{out}(1)$, $V_{out}(2)$, . . . , $V_{out}(n)$.

In particular, with reference to the embodiment represented in FIG. 2, during the reset step $T_1$, the switches $SW_{RST1}$, $SW_{RST2}$, $SW_{S1}$, and $SW_{S2}$ (driven via the signals RST and SAMPLE) are closed. Consequently, the current $i_S$ flows in the switches $SW_{RST1}$ and $SW_{RST2}$ and is absorbed by the output of the OTA 202. In fact, given that the switches $SW_{RST1}$ and $SW_{RST2}$ are closed, the differential output $V_{out}$ is zero, since, by definition of virtual short-circuit, the differential voltage between the input terminals of the operational amplifier 202 is zero. In particular, in the embodiment considered, between the instants $t_0$ and $t_1$ the signal RST is "1", and the signal SAMPLE is "1". In this step, the signal current $i_S$ flows in the switches $SW_{RST1}$ and $SW_{RST2}$, which are closed. If these switches have a very low on-state resistance (ideally zero) the signal current $i_S$ causes a zero voltage drop, and hence the differential voltage $V_{out}$ is zero (as in FIG. 3). Moreover, the voltage $V_{ADC}$ at output from the circuit 80/at input to the A/D converter is equal to $V_{out}$ in so far as the switches $SW_{S1}$ and $SW_{S2}$ are closed.

Consequently, while the control circuit 204 is configured for regulating the gate-to-source voltage $V_{GS}$ of the transistor $M_B$ in such a way that $(V_{O1P} + V_{O1N})/2 = V_{CM1}$, the operational amplifier 202 imposes that the differential component $(V_{O1P} - V_{O1N})$ is zero.

During the sampling phase $T_4$, the switches $SW_{RST1}$ and $SW_{RST2}$ are open and the switches $SW_{S1}$ and $SW_{S2}$ are closed. Consequently, the current $i_S$ charges the capacitances $C_{GAIN1}$ and $C_{GAIN2}$, thus varying the voltage $V_{out}$ on the differential output of the OTA 202 and likewise also $V_{ADC}$ in so far as the switches $SW_{S1}$ and $SW_{S2}$ are closed. In particular, in the embodiment considered, at the instant $t_1$ the signal RST is set at "0", and hence the switches $SW_{RST1}$ and SW$_{RST2}$ are opened, and therefore the current i$_S$ flows in the capacitances C$_{GAIN1}$ and C$_{GAIN2}$, thus causing charging thereof. For example, in FIG. 3 it is assumed that the current i$_S$ is substantially constant and therefore the charging ramp of the capacitances C$_{GAIN1}$ and C$_{GAIN2}$ has a constant slope. Between the instants t$_2$ and t$_0$', the voltage V$_{ADC}$ then remains stored at the value assumed at the instant t$_2$ thanks to the action of the capacitance C$_S$.

Finally, during the hold phase T$_5$, the switches SW$_{RST1}$ and SW$_{RST2}$ continue to remain open and hence the differential output V$_{out}$ continues to be charged by the current i$_S$; however, in this phase (unlike in the sampling phase) T$_4$ the switches SW$_{S1}$ and SW$_{S2}$ are opened. Consequently, throughout the hold phase T$_5$, the voltage V$_{ADC}$ remains "frozen" constant at the value of the voltage V$_{out}$ assumed at the instants t$_2$.

As explained previously, during the sampling phase the current i$_S$ charges the capacitances C$_{GAIN1}$ and C$_{GAIN2}$. In particular, by choosing the capacitances of these capacitors so that C$_{GAIN1}$=C$_{GAIN2}$=C$_{GAIN}$, the current i$_S$ is integrated by this capacitance C$_{GAIN}$.

Hence, a generic j-th sample V$_{out}$(j) may be obtained as the integral of the current i$_S$ during the sampling window between the respective instants t$_1$ and t$_2$:

$$V_{out} = \frac{1}{C_{GAIN}} \cdot \int_{t1}^{t2} i_S(t)dt \quad (20)$$

For example, assuming for simplicity that the current i$_S$(t) is substantially constant in the time interval between t$_1$ and t$_3$ and equal to the value i$_{S,j}$, and considering moreover that the duration of the interval T$_1$, is constant, e.g., T$_1$=N$_S$/f$_{OSC}$, then Eq. (20) can be written as follows:

$$V_{out,j} = \frac{1}{C_{GAIN}} \cdot T_1 \cdot i_{S,j} = \frac{1}{C_{GAIN}} \cdot \frac{N_s}{f_{osc}} \cdot i_{S,j} \quad (21)$$

For example, substituting the current i$_{s,j}$ with the expression defined by Eq. (16), then Eq. (21) can be written as follows:

$$V_{out,j} = \frac{1}{C_{GAIN}} \cdot \frac{N_S}{f_{osc}} \cdot \left[\frac{I_B}{n\phi_t} \cdot \alpha_{VGS}(T_{amb})\Delta T_{TMOS} + I_{SC}\right] \quad (22)$$

The inventors have noted that Eq. (22) can then be reformulated as follows:

$$V_{out,j} = \frac{1}{C_{GAIN}} \cdot \frac{N_S}{f_{osc}} \cdot \frac{I_B}{\phi_t} \cdot \left[\frac{\alpha_{VGS}(T_{amb})}{n} \cdot \Delta T_{TMOS} + \frac{\phi_t}{I_B} \cdot I_{SC}\right] \quad (23)$$

In fact, Eq. (23) highlights the fact that, if the bias current I$_B$ and the clock frequency f$_{OSC}$ are chosen with given characteristics, the implementation can be rendered robust and insensitive to the process spread, i.e., to the variation of the resistances and capacitances. In particular, in various embodiments, the current generators 206 and 208, and the oscillator 72 are configured in such a way that the coefficient I$_B$/f$_{OSC}$ will remain constant.

Specifically, in various embodiments, the current generators 206 and 208 are configured as PTAT current generators, i.e., ones which supply a current proportional to the temperature.

Figure 8:
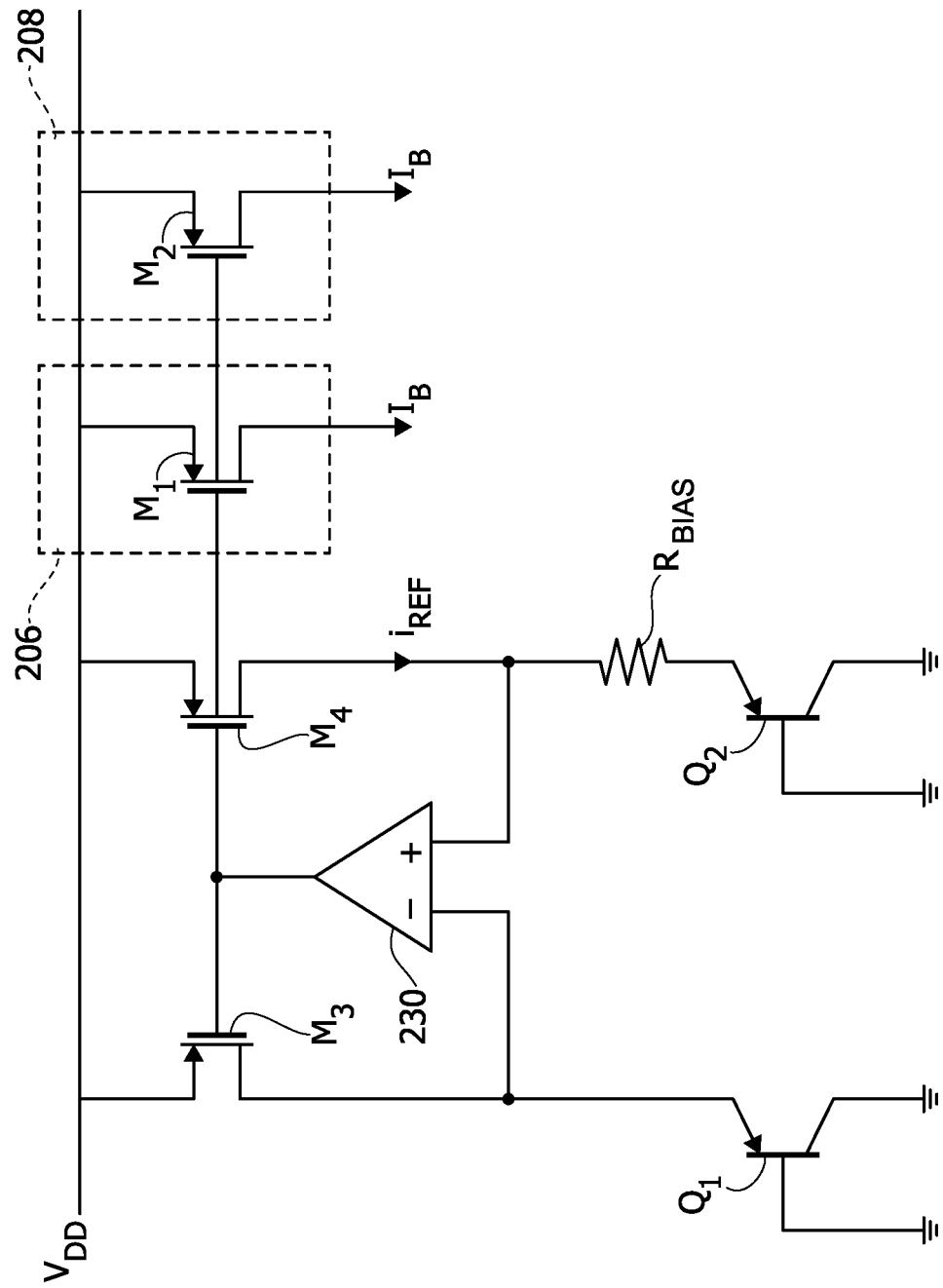
FIG. 8 shows a detail of the amplification interfaces of FIGS. 2, 4, 6, and 7.

These PTAT current generators are well known. For example, FIG. 8 shows a possible embodiment of a PTAT current generator.

In the embodiment considered, the above current generator comprises a first bipolar transistor Q1, for example, a pnp transistor, and a second bipolar transistor Q2, for example a pnp transistor. For instance, in the embodiment considered, the collector and the base of the transistor Q1, and the collector and the base of the transistor Q2 are connected to a reference voltage, for example ground.

Furthermore, appropriate biasing circuits are provided for the transistors Q1 and Q2. For example, in the embodiment considered, there is a first current generator in the form of a FET M3, for example of the p-channel type, which supplies a bias current to the emitter of the transistor Q1, and a second current generator in the form of a FET M4, for example of the p-channel type, which supplies a bias current to the emitter of the transistor Q2.

The bias current supplied by the transistor M4, i.e., the current that traverses the transistor Q2, also traverses a resistor R$_{BIAS}$. In particular, in the embodiment considered, the source terminal of the transistor M3 is connected (for example, directly) to a supply voltage, e.g., V$_{DD}$, and the drain terminal of the transistor M3 is connected (for example, directly) to the emitter of the transistor Q1. Likewise, the source terminal of the transistor M4 is connected (for example, directly) to the supply voltage, e.g., V$_{DD}$, and the drain terminal of the transistor M4 is connected (for example, directly) to a first terminal of the resistor R$_{BIAS}$, and a second terminal of the resistor R$_{BIAS}$ is connected (for example, directly) to the emitter of the transistor Q2.

Consequently, the transistors Q1 and Q2 are biased, and the voltage on the emitter of the transistor Q1 corresponds to the emitter-to-base voltage V$_{EB1}$ of the transistor Q1, and the voltage on the emitter of the transistor Q2 corresponds to the emitter-to-base voltage V$_{EB2}$ of the transistor Q2.

The voltage difference $\Delta V_{BE}=V_{EB1}-V_{EB2}$ is then applied to the resistor R$_{BIAS}$. In particular, in the embodiment considered, the current generator comprises, for this purpose, an operational amplifier 230, where:

a first input terminal of the operational amplifier 230 (typically, the negative terminal) is connected (for example, directly) to the emitter of the transistor Q1/drain terminal of the transistor M3;

a second input terminal of the operational amplifier 230 (typically, the positive terminal) is connected (for example, directly) to the drain terminal of the transistor M4; and the output terminal of the operational amplifier 230 drives the gate terminals of the transistors M3 and M4.

Consequently, in the embodiment considered, the voltage V$_{EB1}$ is applied by the virtual short-circuit of the operational amplifier 230 across the resistor R$_{BIAS}$, since the operational amplifier 230 regulates the current that traverses the resistor R$_{BIAS}$ accordingly. In the embodiment considered, the current that traverses the resistor R$_{BIAS}$ hence corresponds to a reference current i$_{REF}$ that depends upon the resistance R$_{BIAS}$ and the voltage difference $\Delta V_{BE}=V_{EB1}-V_{EB2}$.

In the embodiment considered, the current i$_{REF}$ is then also transferred to the output of the current generator; i.e., the current generator supplies a current I$_B$ proportional to the current i$_{REF}$. For example, in the embodiment considered, a transistor M1 is used, where the source terminal is connected (for example, directly) to the supply voltage, the gate terminal is connected (for example, directly) to the gate terminal of the transistor M4, and the drain terminal supplies the current I$_B$. Consequently, the transistor M1 could correspond to the current generator 206 of FIG. 2 that is connected to the terminal 102. Likewise, the current generator 208 may be provided by adding a transistor M2, where the source terminal is connected (for example, directly) to the supply voltage, the gate terminal is connected (for example, directly) to the gate terminal of the transistor M4, and the drain terminal supplies the current $I_B$ to the terminal 104.

Other schemes of PTAT current generators are described, for example, in U.S. Pat. No. 8,159,206 or in Carlos Christoffersen, et al., "An Ultra-Low Power CMOS PTAT Current Source", Proceedings of the Argentine-Uruguay School of Micro-Nanoelectronics, Technology and Applications 2010, EAMTA 2010, the contents of both of which are hereby incorporated by reference.

Consequently, in various embodiments, a PTAT current generator comprises one or more transistors that supply a reference voltage $\Delta V_{BE}$, which corresponds to a voltage difference which is applied to a bias resistance $R_{BIAS}$, and the current ($i_{REF}$) that traverses the resistor $R_{BIAS}$ is applied, possibly by one or more current mirrors, to the output of the current generator. i.e.

$$I_B \sim \frac{\Delta V_{BE}}{R_{BIAS}} \quad (24)$$

For example, the current of a PTAT current generator may be defined as:

$$I_B = \frac{\phi_t \ln(b)}{R_{BIAS}} \quad (25)$$

In particular, in the embodiment represented in FIG. 8, the parameter b is the ratio between the area A2 of the transistor Q2 and the area A1 of the transistor Q1, i.e., A2=·A1, with b>1. The parameter b is hence a constant number, which can be fixed with a good precision (being a ratio of areas).

Instead, in various embodiments, the oscillator 72 is based upon an RC oscillator. These RC oscillators may be from, for example, U.S. Pat. No. 6,590,463, the contents of which are hereby incorporated by reference. In particular, an RC oscillator comprises a resistor $R_{OSC}$ and a capacitor $C_{OSC}$, and the clock frequency $f_{OSC}$ is proportional to the inverse of an RC product; namely, $$f_{osc} \sim \frac{1}{R_{osc} \cdot C_{osc}} \quad (26)$$

The proportionality may be rendered explicit by introducing a gain coefficient $G_{OSC}$ of the oscillator; i.e., $$f_{osc} = \frac{G_{osc}}{R_{osc} \cdot C_{osc}} \quad (27)$$

In this context, the inventors have noted that, by appropriately sizing the above values, the influence of the process spread may be (at least partially) compensated. In particular, in various embodiments, the oscillator 72 is configured in such a way that:

$$R_{OSC} = M \cdot R_{BIAS} \quad (28)$$

$$C_{OSC} = P \cdot C_{GAIN} \quad (29)$$

where P and M are coefficients.

Consequently, in various embodiments, the resistance $R_{OSC}$ of the oscillator 72 and the resistance $R_{BIAS}$ of the current generators 206 and 208 are obtained with the same process. Furthermore, in various embodiments, these resistances are provided in the same integrated circuit/die and are preferably arranged in the proximity of one another in such a way as to be exposed to the same temperature variations.

Likewise, in various embodiments, the capacitance $C_{OSC}$ of the oscillator 72 and the capacitance $C_{GAIN}$ of the integrator 20 are obtained using the same process. Furthermore, in various embodiments, these capacitances are provided in the same integrated circuit/die and are preferably arranged in the proximity of one another in such a way as to be exposed to the same temperature variations.

Consequently, in various embodiments, Eq. (23) corresponds to $$V_{out} = \frac{N_S \cdot M \cdot P \cdot \ln(b)}{G_{osc}} \cdot \left[ \frac{\alpha_{VGS}(T_{amb})}{n} \cdot \Delta T_{TMOS} + \frac{R_{BIAS}}{\ln(b)} \cdot I_{SC} \right] \quad (30)$$

This equation highlights also why the current $I_{sc}$ is useful for carrying out an offset correction in the differential output signal $V_{out}$. In particular, as explained previously, the current generator 50, together with the circuit 204 that carries out the common-mode control, makes it possible to correct any possible leakage or undesired signals that might lead the OTA block 202 and/or the A/D converter 30 to exit from the dynamic range of proper operation, or else might lead the TMOS transistors out of the desired operating point. Hence, the system proposed is robust for compensating possible leakage-current signals injected into the high-impedance nodes $V_{O1N}$ and $V_{O1NP}$, i.e., the input terminals of the integrator circuit 20. In particular, the common-mode component of these leakage signals is compensated by the circuit 204, thus preventing common-mode drifts. Instead, the differential leakage component may be eliminated by tuning, i.e., trimming, the value of the current $I_{SC}$ supplied by the current generator 50.

The way in which the current $I_{SC}$ is generated defines the type of offset compensation that is carried out.

For example, in various embodiments, the current generator is programmable for supplying a variable current $I_{SC}$. For instance, for this purpose, a circuit, for example the processing circuit 40, can monitor the voltage $V_{out}$ and vary the current $I_{SC}$ as a function of the voltage $V_{out}$. For instance, in this context, reference may be made to Italian Patent Application No. 102019000001847, the contents of which are hereby incorporated by reference.

In particular, this document describes amplification interfaces, where the current generator 50 may be an IDAC (Current Digital-to-Analog Converter), which hence supplies a current that has an amplitude variable as a function of a digital signal having a plurality of bits.

Moreover, this document describes the fact that, in the case of an amplifier provided by an analog integrator, the current generator could also supply a current that is modulated, for example by a PWM (Pulse-Width Modulation) signal, thereby varying the mean value of the current supplied by the current generator 50. For example, the current generator 50 may supply, as a function of a driving signal, a positive current or a negative current. Consequently, when the driving signal has a first logic value, the current generator 50 supplies the positive current, and, when the driving signal has a second logic value, the current generator 50 supplies the negative current. Hence, the control circuit 70 can determine for each measurement interval $T_2$ a first duration $T_3$ during which the driving signal has the first logic value, and a second duration $(T_2-T_3)$ during which the driving signal has the second logic value. Consequently, by varying the duration $T_3$ it is possible to choose, for each measurement interval $T_2$, the mean value of the current $I_{SC}$ supplied by the current generator 50. This modulation is not perceivable by the A/D converter 30, since the analog integrator supplies at output the integral of the current, which, at the end of a measurement/sampling interval, only represents the mean value of the current.

For example, by applying this to the circuit scheme shown in FIG. 2, the control circuit 70 can be configured, during each measurement interval $T_2$, for:

activating the current generator 52 and deactivating the generator 58 for the duration $T_3$; and deactivating the current generator 52 and activating the generator 58 for the duration $(T_2-T_3)$.

In this case, the current generators 52 and 58 can hence be configured for supplying a respective constant current. Preferably, the current generators 52 and 58 supply in this case currents with the same amplitude but with opposite sign.

However, the current generator 50 may even not be programmable.

For example, in various embodiments, the current generator 50 generates the current $I_{SC}$ as a bandgap current, where a reference voltage $V_{REF}$ supplied by a bandgap voltage generator (i.e., one that does not vary with temperature) is used. For example, reference may be made to Kleczek, et al. "Low voltage area efficient current-mode CMOS bandgap reference in deep submicron technology" 2014 Proceedings of the 21st International Conference Mixed Design of Integrated Circuits and Systems (MIXDES) (2014): 247-251, the contents of which are hereby incorporated by reference. In particular, this document describes, in the introductory part, various solutions for generation of a PTAT or bandgap current.

In this case, also the offset correction that is obtained is independent of the temperature. For instance, in this case, the current $I_{SC}$ is typically $$I_{SC} \sim \frac{V_{REF}}{R_{BIAS2}} \quad (31)$$

In various embodiments, the resistance $R_{BIAS2}$ of the current generator 50 and the resistance $R_{BIAS}$ of the current generators 206 and 208 are obtained with the same process. Furthermore, in various embodiments, these resistances are provided in the same integrated circuit/die and are preferably set in the proximity of one another in such a way as to be exposed to the same temperature variations; namely, $$I_{SC} = \frac{V_{REF}}{B \cdot R_{BIAS}} \quad (32)$$

Consequently, in this case, Eq. (30) can be reformulated as follows:

$$V_{out} = \frac{N_S \cdot M \cdot P \cdot \ln(b)}{G_{osc}} \cdot \left[ \frac{\alpha_{VGS}(T_{amb})}{n} \cdot \Delta T_{TMOS} + \frac{V_{REF}}{B \cdot \ln(b)} \right] \quad (33)$$

Instead, in other embodiments, the current generator 50 generates the current $I_{SC}$ as a PTAT current (i.e., a current proportional to the temperature), for example, $$I_{SC} \sim \frac{\Delta V_{BE}}{R_{BIAS2}} \quad (34)$$

for instance, $$I_{SC} = \frac{\phi_t \ln(a)}{R_{BIAS2}} \quad (35)$$

In various embodiments, the resistance $R_{BIAS2}$ of the current generator 50 and the resistance $R_{BIAS}$ of the current generators 206 and 208 are obtained with the same process. Furthermore, in various embodiments, these resistances are provided in the same integrated circuit/die and are preferably arranged in the proximity of one another in such a way as to be exposed to the same temperature variations; for example, $$I_{SC} = \frac{\phi_t \ln(a)}{B \cdot R_{BIAS}} = \frac{\ln(a)}{B \cdot R_{BIAS}} \cdot \frac{k}{q} \cdot T \quad (36)$$

Consequently, in this case, Eq. (30) can be reformulated as follows:

$$V_{out} = \frac{N_S \cdot M \cdot P \cdot \ln(b)}{G_{osc}} \cdot \left[ \frac{\alpha_{VGS}(T_{amb})}{n} \cdot \Delta T_{TMOS} + \frac{\ln(a)}{B \cdot \ln(b)} \cdot \frac{k}{q} \cdot T \right] \quad (37)$$

From Eqs. (33) and (37) it may be noted how in the approach proposed the dependence of the output signal upon the spread of the technological process used for manufacturing the resistances and the capacitances has been eliminated, since there remain only the coefficients of proportionality B, M, and P.

This result has been obtained thanks to the architectural choice made and thanks to an appropriate choice of the bias current $I_B$ and of the clock frequency $f_{OSC}$. Moreover, from Eq. (33) it may be concluded that in the first case ($I_{SC}$ of a bandgap type) a possible offset independent of the temperature T may be corrected, whereas in the second case ($I_{SC}$ of a PTAT type) a possible offset that varies in temperature can be corrected. In general, the current generator 50 could also be implemented with two current generators, where the first supplies a current $I_{SC1}$ of a bandgap type and the second supplies a current $I_{SC2}$ of a PTAT type, which hence enables correction of an offset contribution that, in addition to a part that does not vary in temperature, also has a part variable in temperature.

Figure 4:
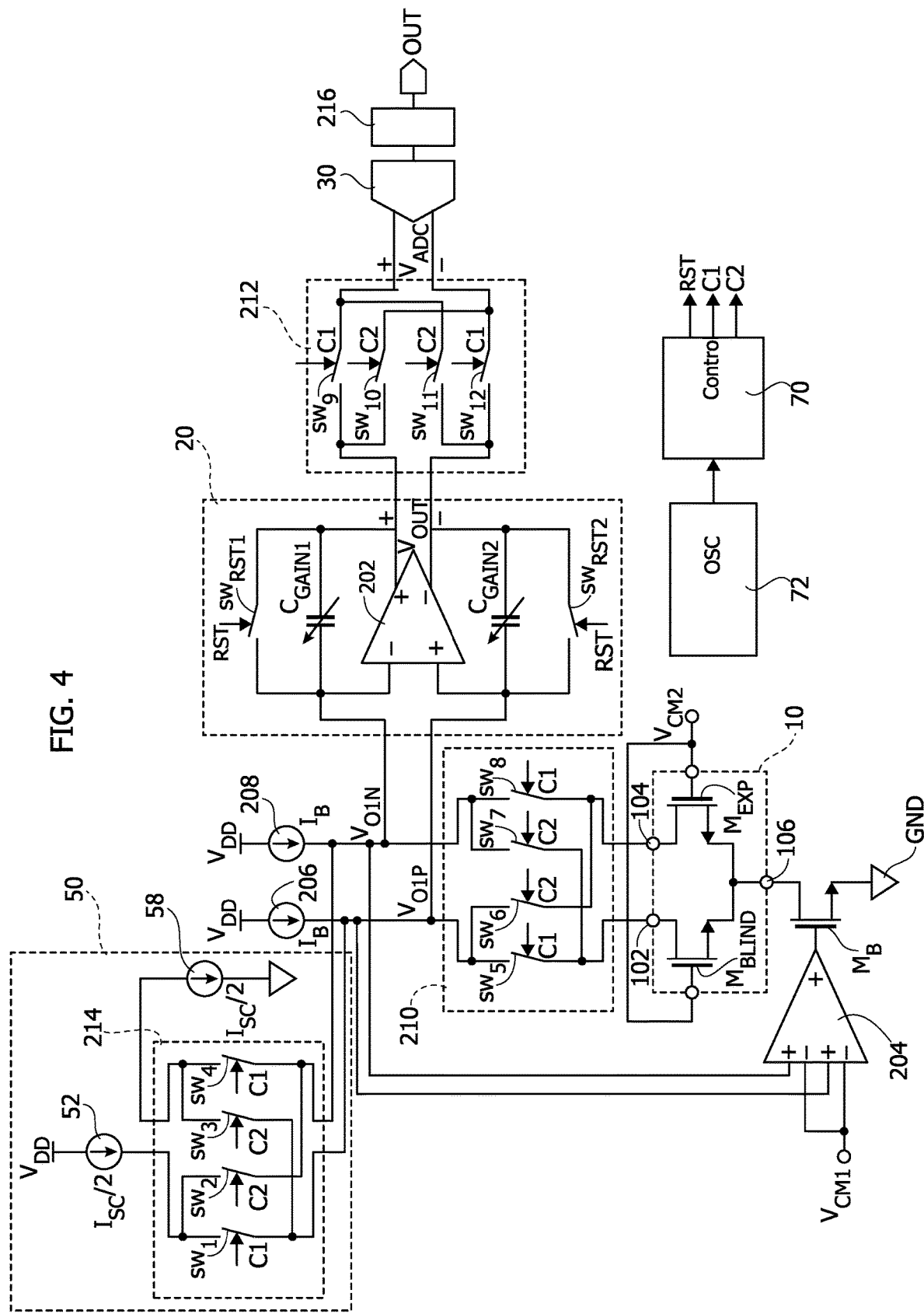
FIG. 4 shows a second embodiment of an amplification interface.

FIG. 4 shows a second embodiment. Basically, as compared to FIG. 2, the amplification interface moreover comprises three circuits 210, 212 and 214. In addition, the control circuit 70 is configured for generating two control signals C1 and C2 for these circuits, and the amplifier 20 or the processing circuit 40 comprises a circuit module 216 configured for processing the digital samples supplied by the A/D converter 30.

In particular, the circuits 210, 212, and 214 are chopper circuits that reverse the connection between two respective circuits.

In particular, in the embodiment considered, the current generator 208 is connected to the first input terminal of the current integrator 20 (for example, the negative terminal), and the current generator 206 is connected to the second input terminal of the current integrator 20 (for example, the positive terminal).

In this case, as a function of the signals C1 and C2, the chopper circuit 210 is configured for selectively connecting the transistor $M_{EXP}$ to the first input terminal or to the second input terminal of the current integrator 20, and likewise the transistor $M_{BLIND}$ to the second input terminal or to the first input terminal of the current integrator 20.

For instance, in the embodiment considered, the chopper circuit 210 comprises: a switch $SW_5$ for selectively connecting the transistor $M_{BLIND}$ to the second input terminal of the current integrator 20 as a function of the signal C1; and a switch $SW_7$ for selectively connecting the transistor $M_{BLIND}$ to the first input terminal of the current integrator 20 as a function of the signal C2. Moreover, the chopper circuit 210 comprises a switch $SW_8$ for selectively connecting the transistor $M_{EXP}$ to the first input terminal of the current integrator 20 as a function of the signal C1 and a switch $SW_6$ for selectively connecting the transistor $M_{EXP}$ to the second input terminal of the current integrator 20 as a function of the signal C2.

Likewise, as a function of the signals C1 and C2, the chopper circuit 214 is configured for selectively connecting the current generator 58 to the first input terminal or to the second input terminal of the current integrator 20, and likewise the current generator 52 to the second input terminal or to the first input terminal of the current integrator 20.

For instance, in the embodiment considered, the chopper circuit 214 comprises: a switch $SW_2$ for selectively connecting the current generator 52 to the second input terminal of the current integrator 20 as a function of the signal C1; and a switch $SW_2$ for selectively connecting the current generator 52 to the first input terminal of the current integrator 20 as a function of the signal C2. Moreover, the chopper circuit 214 comprises: a switch $SW_4$ for selectively connecting the current generator 58 to the first input terminal of the current integrator 20 as a function of the signal C1; and a switch $SW_3$ for selectively connecting the current generator 58 to the second input terminal of the current integrator 20 as a function of the signal C2.

Consequently, the chopper circuits 210 and 214 make it possible to reverse the connection, respectively, of the transistors $M_{EXP}$ and $M_{BLIND}$ and of the current generators 52 and 58 to the input terminals of the current integrator 20.

In the embodiment considered, the chopper circuit 212 is configured for reversing the connection of the output of the integrator 20 to the input of the A/D converter 30, i.e., for inverting the output voltage $V_{out}$ of the current integrator 20.

For instance, in the embodiment considered, the chopper circuit 212 comprises: a switch $SW_9$ for selectively connecting the positive output terminal of the current integrator 20 to the positive input terminal of the A/D converter 30 as a function of the signal C1; and a switch $SW_{10}$ for selectively connecting the positive output terminal of the current integrator 20 to the negative input terminal of the A/D converter 30 as a function of the signal C2. Moreover, the chopper circuit 212 comprises: a switch $SW_{12}$ for selectively connecting the negative output terminal of the current integrator 20 to the negative input terminal of the A/D converter 30 as a function of the signal C1; and a switch $SW_{11}$ for selectively connecting the negative output terminal of the current integrator 20 to the positive input terminal of the A/D converter 30 as a function of the signal C2.

In general, the chopper circuit 212 can also implement the switches $SW_{S1}$ and $SW_{S2}$ of the sample-and-hold circuit 80 of FIG. 2. In fact, in the embodiment considered, by opening the switches $S_9$, $S_{10}$, $S_{11}$, and $S_{12}$, the A/D converter is disconnected from the output of the integrator 20.

Figure 5:
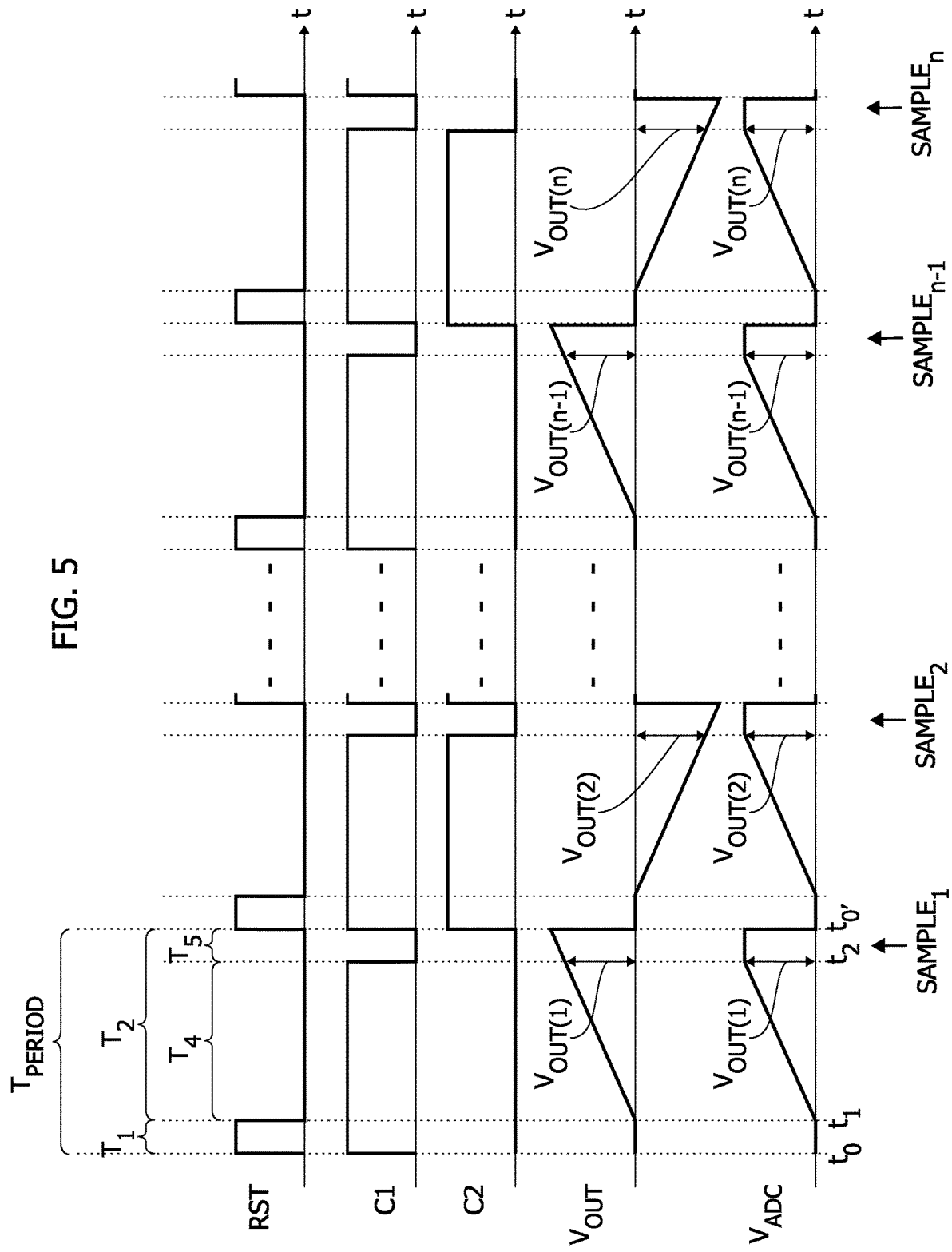
FIG. 5 shows an embodiment of operation of the amplification interface of FIG. 4.

FIG. 5 shows a possible operation of the control circuit 70.

In the embodiment considered, during each interval $T_{PERIOD}$, the control circuit 70 drives one of the signals C1 or C2, and the other signal is kept at its logic level. For instance, during the first interval the signal C1 is varied, and during the second interval the signal C2 is varied.

Consequently, operation of the circuit during the first interval basically corresponds to what has been described with reference to FIG. 2, where the current generator 58 and the transistor $M_{EXP}$ are connected to the first input terminal of the integrator 20, and the current generator 52 and the transistor $M_{BLIND}$ are connected to the second input terminal of the integrator 20. Moreover, the signal C1 performs the function of the signal SAMPLE described with reference to FIG. 3. Consequently, in the embodiment considered, the control circuit 70:

resets the integrator 20 (using the switches $SW_{RST1}$ and $SW_{RST2}$ and the signal RST) at an instant $t_0$;

activates the integrator 20 (using the switches $SW_{RST1}$ and $SW_{RST2}$ and the signal RST) at an instant $t_1$; and disconnects the output of the integrator (using the switches $SW_9$ and $SW_{12}$ and the signal C1) at an instant $t_2$, thus enabling sampling of the voltage $V_{ADC}$.

Instead, operation of the circuit during the second interval is reversed. In particular, the current generator 58 and the transistor $M_{EXP}$ are connected to the second input terminal of the integrator 20, and the current generator 52 and the transistor $M_{BLIND}$ are connected to the first input terminal of the integrator 20. Moreover, the signal C2 performs the function of the signal SAMPLE described with reference to FIG. 3. Consequently, in the embodiment considered, the control circuit:

resets the integrator 20 (using the switches $SW_{RST1}$ and $SW_{RST2}$ and the signal RST) at an instant $t_0$;

activates the integrator 20 (using the switches $SW_{RST1}$ and $SW_{RST2}$ and the signal RST) at an instant $t_1$; and disconnects the output of the integrator (using the switches $SW_{10}$ and $SW_{11}$ and the signal C2) at an instant $t_2$, thus enabling sampling of the voltage $V_{ADC}$.

For this reason, the integrator 20 integrates, during the second interval, a current $i_S$ that has an opposite sign with respect to the current $i_S$ during the first interval (since the input of the integrator 20 is substantially reversed).

Consequently, also the output voltage $V_{out}$ increases during an interval (for example, the first interval for the case provided by way of example) and decreases during the other (for example, the second interval for the case provided by way of example). However, by inverting the output of the integrator 20, the voltage $V_{ADC}$ will always present the same behavior.

In various embodiments, the block 216 consequently carries out a calculation of the mean value of the digital sample and may, for example, be a moving-average filter that receives at input the samples from the ADC 30 at the sampling frequency $1/T_{PERIOD}$, and produces at output a signal at the sampling frequency $1/T_{PERIOD}$, where each sample is obtained by averaging the last n samples received from the ADC (where n is preferably considered an even number).

In general, introduction of the block 216 downstream of the ADC 30 is possible also in the embodiment of FIG. 2 in order to average the output signals produced at the sampling frequency $T_{PERIOD}$, thus obtaining a signal that is averaged and hence less noisy. In general, also in the approach of FIG. 4, introduction of the block 216 likewise enables a reduction of the noise. However, in FIG. 4 it is not only a possible improvement, but its introduction also enables elimination of the component that the output signal presents at the chopping frequency.

In general, similar chopping operations may be used for eliminating the offset of the OTA 202. Instead, in the embodiment considered, such chopping operations are also extended for compensating the differences between the current generators. In the embodiment considered, the chopping frequency is hence half of the sampling frequency.

In particular, as mentioned previously, the integrator 20 is configured for integrating, during a first interval, a current $$i_S = i_{SIG\_EXP} - i_{SIG_{BLIND}} + I_{SC} = \frac{I_B}{n\phi_t} \cdot \alpha_{VGS}(T_{amb})\Delta T_{TMOS} + I_{SC} \quad (38)$$

and, during the second interval, a current $$i_S = -i_{SIG_{EXP}} + i_{SIG_{BLIND}} - I_{SC} = -\frac{I_B}{n\phi_t} \cdot \alpha_{VGS}(T_{amb})\Delta T_{TMOS} - I_{SC} \quad (39)$$

Consequently, the signal $V_{OUT}$ that is obtained from integration has a slope of a different sign during the first and second intervals. However, if there is also considered the further signal inversion carried out by the circuit 212 inserted before the A/D converter 30, the signal will always have the same sign.

Hence, from a mathematical standpoint, the signal $V_{ADC}$ would have to be equal to the one obtained with the embodiment illustrated in FIG. 2. Instead, in the actual implementation, the two current generators 206 and 208 may present a mismatch (denoted hereinafter by $\Delta I_B$), and/or the OTA block 202 may present an equivalent offset at input (denoted hereinafter by $V_{off\_OTA}$).

Assuming that both of the non-idealities $\Delta I_B$ and $V_{off\_OTA}$ are present, two successive samples $V_{out}(j)$ and $V_{out}(j+1)$ will have the following values in the embodiment represented in FIG. 2:

$$V_{ADC}(j) = V_{out}(j) \quad (40)$$
$$= \frac{N_S \cdot M \cdot P \cdot \ln(b)}{G_{osc}} \cdot$$
$$\left[\frac{\alpha_{VGS}(T_{amb})}{n} \cdot \Delta T_{TMOS} + \frac{R_{BIAS}}{\ln(b)} \cdot (I_{SC} + \Delta I_B)\right] +$$
$$V_{off\_OTA}$$

$$V_{ADC}(j+1) = V_{out}(j+1) \quad (41)$$
$$= \frac{N_S \cdot M \cdot P \cdot \ln(b)}{G_{osc}} \cdot$$
$$\left[\frac{\alpha_{VGS}(T_{amb})}{n} \cdot \Delta T_{TMOS} + \frac{R_{BIAS}}{\ln(b)} \cdot (I_{SC} + \Delta I_B)\right] +$$
$$V_{off\_OTA}$$

Instead, two successive samples $V_{out}(j)$ and $V_{out}(j+1)$ will have the following values in the embodiment represented in FIG. 4:

$$V_{ADC}(j) = V_{out}(j) \quad (42)$$
$$= \frac{N_S \cdot M \cdot P \cdot \ln(b)}{G_{osc}} \cdot$$
$$\left[\frac{\alpha_{VGS}(T_{amb})}{n} \cdot \Delta T_{TMOS} + \frac{R_{BIAS}}{\ln(b)} \cdot (I_{SC} + \Delta I_B)\right] +$$
$$V_{off\_OTA}$$

$$V_{ADC}(j+1) = -V_{out}(j+1) \quad (43)$$
$$= \frac{N_S \cdot M \cdot P \cdot \ln(b)}{G_{osc}} \cdot$$
$$\left[\frac{\alpha_{VGS}(T_{amb})}{n} \cdot \Delta T_{TMOS} + \frac{R_{BIAS}}{\ln(b)} \cdot (I_{SC} - \Delta I_B)\right] -$$
$$V_{off\_OTA}$$

Consequently, by computing the average of both values, or in general an even number of samples, the block 216 filters the effect of the non-idealities $\Delta I_B$ and $V_{off\_OTA}$.

Basically, the filtering carried out on these quantities thanks to the chopping technique is of a high-pass type; i.e., they will be filtered out in the case where they are d.c. quantities or anyway also in the case where they are quantities that vary at low frequency. It may hence be noted how filtering eliminates not only the mismatches $\Delta I_B$ between the two generators but also the low-frequency noise introduced by the two generators $I_B$, thus also improving the performance of the system from the standpoint of the signal-to-noise ratio.

The same effect of cancellation of the aforesaid non-idealities would not be produced by the same block 216 applied at output to the system of FIG. 2 in so far as, by averaging samples such as those described by Eqs. (40) and (41), the effect of $\Delta I_B$ and $V_{off\_OTA}$ would not be filtered out.

Figure 6:
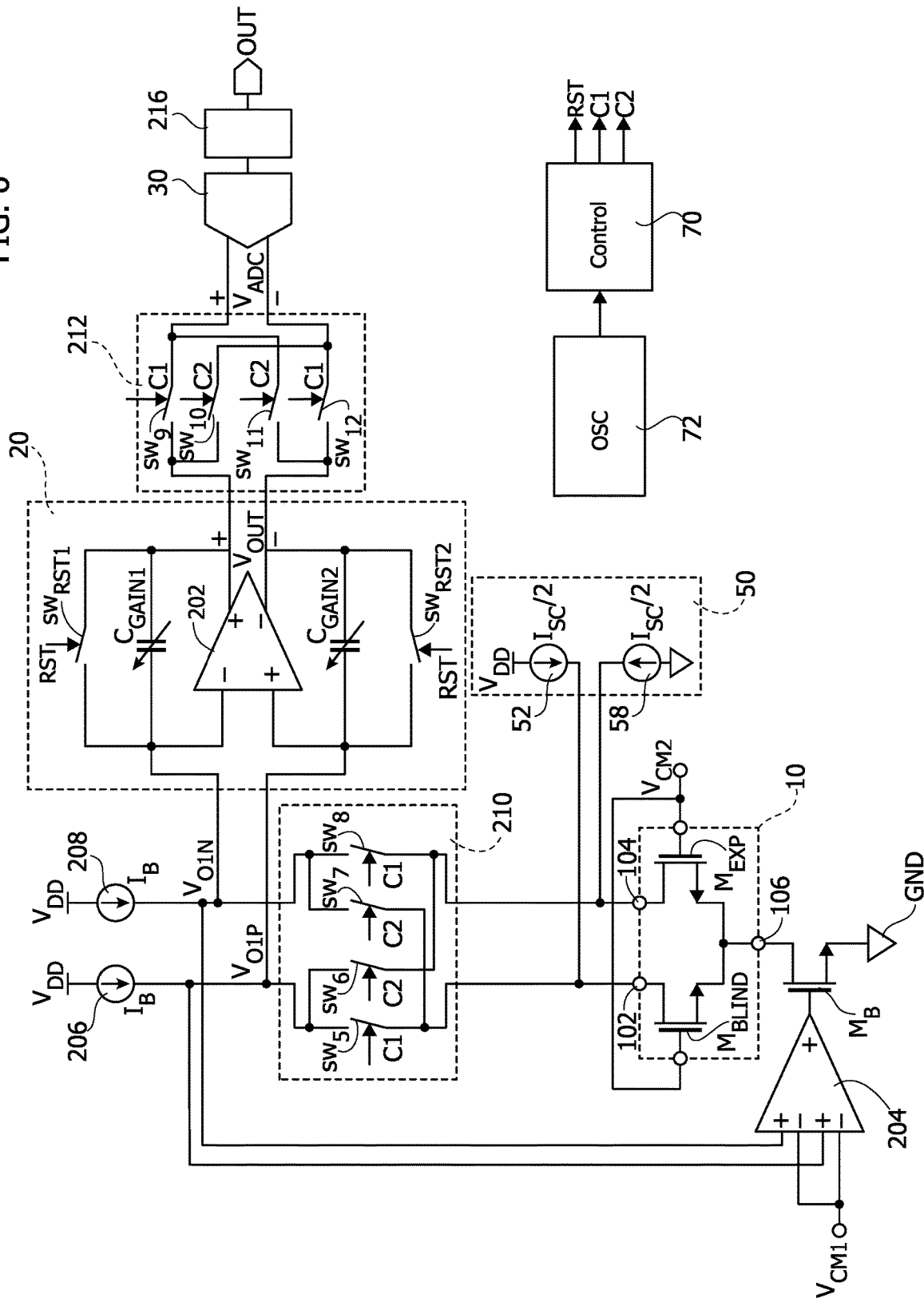
FIG. 6 shows a third embodiment of an amplification interface.

Appearing in FIG. 6 is the scheme of a third embodiment. As compared to the architecture of FIG. 4, the difference is that the signal of correction of offset (from the current generator) is added directly to the signal produced by the TMOS sensor 10. In particular, in the embodiment considered, the current generator 52 is connected to the drain terminal of the transistor $M_{BLIND}$, and the current generator 528 is connected to the drain terminal of the transistor $M_{EXP}$.

In this case, just the chopper circuit 210 may be sufficient. The resulting output signal of the embodiment shown in FIG. 6 is altogether the same as the one presented for the embodiment of FIG. 4; hence, the foregoing description applies also here.

Figure 7:
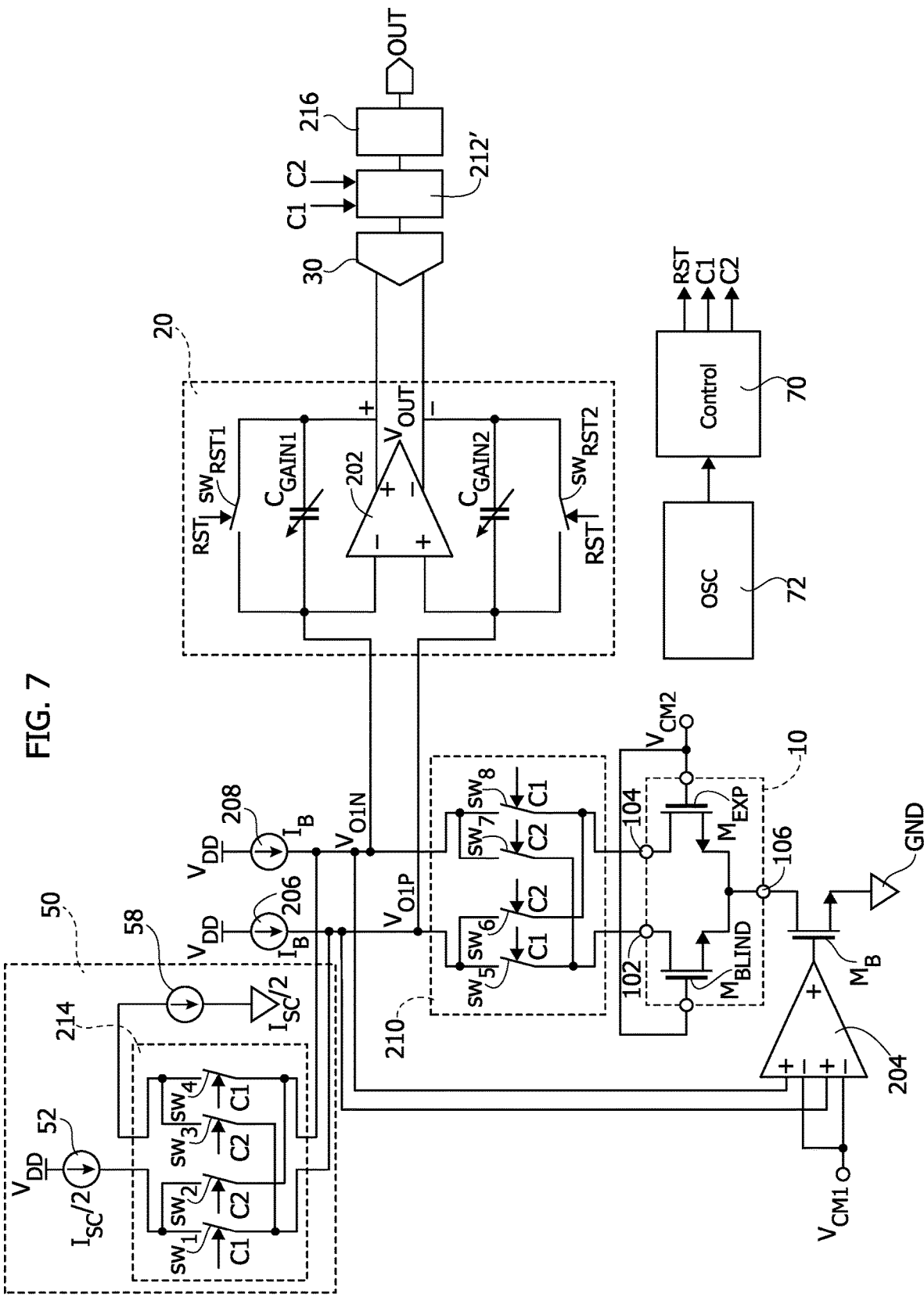
FIG. 7 shows a fourth embodiment of an amplification interface.

Represented in FIG. 7 is the diagram of a fourth circuit architecture proposed by the present invention. As compared to the architecture of FIG. 4 (but a similar modification could be made in the embodiment represented in FIG. 6), the difference is that the chopper circuit 212 has been moved downstream of the A/D converter 30. Consequently, in the embodiment considered, a chopper circuit or module 212' of a digital type is used, for example implemented by means of a digital circuit module of the processing circuit 40. This circuit or module is hence configured for supplying to the circuit 216, as a function of the signals C1 and C2, the value of the digital sample supplied by the A/D converter 30 or the value of the digital sample supplied by the A/D converter 30 multiplied by −1.

Consequently, in various embodiments, the approaches proposed enable amplification of the signal generated by TMOS transistors, without being affected by the technological process spread that affects the resistances and capacitances.

In various embodiments, this has been obtained thanks to the architecture proposed, in addition to an appropriate choice of the bias current $I_B$ and of the reference clock frequency $f_{OSC}$.

In various embodiments, the approach proposed enables correction of the offset and of the variation of the offset as a function of temperature.

In addition, in various embodiments, the approach proposed in its second implementation also enables filtering of the non-idealities in the bias current and the offset of the OTA.

In general, the approach proposed is devised for amplifying the signal generated by TMOS transistors, but it may also be used in the case where the transistors $M_{BLIND}$ and $M_{EXP}$ are two normal MOS transistors, or in general FETs, and at their input (i.e., the gate terminals of the two transistors) there is a differential signal to be amplified.

Of course, without prejudice to the principles of this disclosure, the details of construction and the embodiments may vary widely with respect to what has been described and illustrated herein purely by way of example, without thereby departing from the scope of the present invention, as defined by the ensuing claims.

The claims form an integral part of the technical teaching of the description provided herein.

The invention claimed is:

1. An electronic device, comprising:
   a thermally-isolated metal-oxide semiconducting (TMOS) sensor having a first current input terminal coupled to a first node to receive a first bias current, a second current input terminal coupled to a second node to receive a second bias current, and a current output terminal coupled to a third node;
   a tail transistor having a first conduction terminal coupled to the third node, a second conduction terminal coupled to a reference voltage, and a control terminal;
   a control circuit configured to generate a control signal applied to the control terminal of the tail transistor based upon voltages at the first and second nodes so that a common mode of voltages at the first and second nodes is equal to a reference common mode voltage; and
   a differential current integrator comprising a first input terminal coupled to the second node and a second input terminal coupled to the first node, wherein said differential current integrator is configured to provide an output voltage indicative of an integral of a difference between a first output current at the first input terminal and a second output current received at said second input terminal.

2. The electronic device of claim 1, wherein the TMOS sensor comprises:
   a first TMOS transistor having a drain coupled to the first node, a source coupled to the third node, and a gate; and
   a second TMOS transistor having a drain coupled to the second node, a source coupled to the third node, and a gate coupled to the gate of the first TMOS transistor.

3. The electronic device of claim 2, wherein the first and second TMOS transistors are configured to operate in a subthreshold region.

4. The electronic device of claim 3, wherein the first and second TMOS transistors are sized with a width to length ratio such that gate to source voltages thereof are less than threshold voltages of the first and second TMOS transistors.

5. The electronic device of claim 2, wherein the first and second bias currents are equal.

6. The electronic device of claim 2, wherein the first and second TMOS transistors form an amplifier having a voltage offset; and further comprising a current generator configured to apply correction currents to the first and second nodes that compensate for the voltage offset.

7. The electronic device of claim 1, further comprising a current generator configured to apply a first correction current to the first node and a second correction current to the second node.

8. The electronic device of claim 7, wherein the first and second correction currents are equal in magnitude but opposite in sign.

9. The electronic device of claim 1, wherein a magnitude of each of the first and second bias currents is proportional to absolute temperature.

10. The electronic device of claim 1, wherein the differential current integrator comprises:
    a differential operational amplifier;
    a first capacitor connected between a first output terminal of said differential operational amplifier and the first input terminal;
    a second capacitor connected between a second output terminal of said differential operational amplifier and the second input terminal;
    first and second electronic switches respectively connected in parallel with said first and second capacitors, wherein said first and second electronic switches are driven via a reset signal;
    a control logic circuit configured to:
        generate said reset signal such that said differential current integrator is periodically reset during a reset interval and activated during a measurement interval; and
        during each measurement interval, set said reset signal to a first logic value for a sampling interval and set said reset signal to a second logic value for a hold interval; and
    an RC oscillator having a capacitor and a resistor which define an oscillation period of said RC oscillator, and wherein said control circuit is configured to generate said reset signal such that said sampling interval corresponds to a multiple of said oscillation period of said RC oscillator.

11. The electronic device of claim 10, wherein said control circuit is configured to generate said reset signal such that said sampling interval corresponds to a multiple of said oscillation period of said RC oscillator.

12. The electronic device of claim 11, further comprising first and second current generators generating the first and second bias currents; and wherein the first and second current generators, and the RC oscillator, are collectively configured such that a magnitude of the first bias current multiplied by a frequency of the RC oscillator remains constant over temperature, and such that a magnitude of the second bias current multiplied by the frequency of the RC oscillator remains constant over temperature.

13. The electronic device of claim 12, further comprising:
    a first chopper circuit connected between the first and second input terminal of said differential current integrator, and said first and said second nodes;
    a second chopper circuit connected between said first current generator and said second current generator, and said first and said second nodes; and a third chopper circuit connected between said first and second output terminals of said differential current integrator.

14. The electronic device of claim 10, further comprising an analog to digital converter (ADC) having inputs coupled to outputs of the differential operational amplifier.

15. The electronic device of claim 14, further comprising a chopper circuit coupled between the first and second outputs of the differential operational amplifier and the inputs of the ADC.

16. The electronic device of claim 14, further comprising a processing circuit configured to process digital samples produced by the ADC.

17. The electronic device of claim 16, wherein the processing circuit is configured to operate as moving-average filter that receives digital samples produced by the ADC and produces an output signal at a sampling frequency of the ADC, wherein each sample of the output signal represents an average of a given number of prior digital samples produced by the ADC.

18. An electronic device, comprising:
a sensor having a first current input terminal coupled to a first node to receive a first bias current, a second current input terminal coupled to a second node to receive a second bias current, and a current output terminal coupled to a third node;
wherein the sensor comprises first and second transistors forming an amplifier having a voltage offset, the first transistor having a drain coupled to the first node, a source coupled to the third node, and a gate, the second transistor having a drain coupled to the second node, a source coupled to the third node, and a gate coupled to the gate of the first transistor;
a current generator configured to apply correction currents to the first and second nodes that compensate for the voltage offset;
a tail transistor having a first conduction terminal coupled to the third node, a second conduction terminal coupled to a reference voltage, and a control terminal;
a control circuit configured to generate a control signal applied to the control terminal of the tail transistor based upon voltages at the first and second nodes; and
a differential current integrator comprising a first input terminal coupled to the second node and a second input terminal coupled to the first node.

19. The electronic device of claim 18, wherein the first and second transistors are configured to operate in a sub-threshold region.

20. The electronic device of claim 19, wherein the first and second transistors are sized with a width to length ratio such that gate to source voltages thereof are less than threshold voltages of the first and second transistors.

21. The electronic device of claim 18, wherein the first and second bias currents are equal.

22. The electronic device of claim 18, wherein the current generator applies a first correction current to the first node and a second correction current to the second node.

23. The electronic device of claim 22, wherein the first and second correction currents are equal in magnitude but opposite in sign.

24. The electronic device of claim 18, wherein a magnitude of each of the first and second bias currents is proportional to absolute temperature.

25. The electronic device of claim 12, wherein the first and second current generators generate the first and second bias currents to have magnitudes being proportional to absolute temperature (PTAT).

26. The electronic device of claim 25, wherein the capacitor and resistor of the RC oscillator define an oscillation frequency of said RC oscillator, with the oscillation frequency being equal to a gain coefficient divided by a product of a resistance of the capacitor and a resistance of the resistor, with the resistance of the resistor being equal to a resistance of the first current generator or second current generator multiplied by a first coefficient and the capacitance of the capacitor being equal to a capacitance of the first capacitor of the differential current integrator or the second capacitor of the differential current integrator.

* * * * *